(12) United States Patent
Kishi et al.

(10) Patent No.: US 10,053,773 B2
(45) Date of Patent: Aug. 21, 2018

(54) METHOD OF CLEANING PLASMA PROCESSING APPARATUS

(71) Applicant: TOKYO ELECTRON LIMITED, Tokyo (JP)

(72) Inventors: Hiroki Kishi, Miyagi (JP); Mitsuru Hashimoto, Miyagi (JP); Keiichi Shimoda, Miyagi (JP); Eiichi Nishimura, Miyagi (JP); Akitaka Shimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 320 days.

(21) Appl. No.: 14/635,978

(22) Filed: Mar. 2, 2015

(65) Prior Publication Data
US 2015/0247235 A1    Sep. 3, 2015

(30) Foreign Application Priority Data
Mar. 3, 2014 (JP) .................................. 2014-040524

(51) Int. Cl.
| | |
|---|---|
| C23C 14/00 | (2006.01) |
| C23C 14/32 | (2006.01) |
| C23C 16/44 | (2006.01) |
| H01J 37/305 | (2006.01) |
| H01J 37/32 | (2006.01) |

(52) U.S. Cl.
CPC ...... *C23C 16/4405* (2013.01); *C23C 16/4401* (2013.01); *H01J 37/3053* (2013.01); *H01J 37/32091* (2013.01); *H01J 37/32862* (2013.01); *H01J 2237/022* (2013.01)

(58) Field of Classification Search
CPC .......................... C23C 16/4405; C23C 14/022
See application file for complete search history.

(56) References Cited

U.S. PATENT DOCUMENTS

| | | | |
|---|---|---|---|
| 2002/0065616 A1* | 5/2002 | Leng | ........................ H01L 22/20 |
| | | | 702/50 |
| 2002/0074014 A1 | 6/2002 | Yeh et al. | |
| 2002/0162827 A1 | 11/2002 | Yeh et al. | |
| 2004/0103914 A1* | 6/2004 | Cheng | .................. B08B 7/0035 |
| | | | 134/1.1 |
| 2006/0191555 A1 | 8/2006 | Yoshida et al. | |
| 2008/0035170 A1* | 2/2008 | Baek | ..................... B08B 7/0035 |
| | | | 134/1.1 |
| 2013/0203255 A1 | 8/2013 | Guha et al. | |

FOREIGN PATENT DOCUMENTS

| | | |
|---|---|---|
| JP | 8-22980 A | 1/1996 |
| JP | 9-129623 A | 5/1997 |
| JP | 10-233388 A | 9/1998 |
| JP | 2010-50310 A | 3/2010 |

\* cited by examiner

*Primary Examiner* — Ibrahime A Abraham
(74) *Attorney, Agent, or Firm* — Rothwell, Figg, Ernst & Manbeck, P.C.

(57) ABSTRACT

There is provided a cleaning method for removing a first deposit, formed on an upper electrode through an etching of a metal layer containing a metal, by using a plasma generated between a lower electrode of a lower structure and the upper electrode in a processing chamber of a plasma processing apparatus. The method includes a step of colliding ions with the first deposit formed on the upper electrode and a step of removing a second deposit, which is generated by said colliding and formed on the lower structure. Further, a cycle including the step of colliding and the step of removing is repeated multiple times.

13 Claims, 19 Drawing Sheets

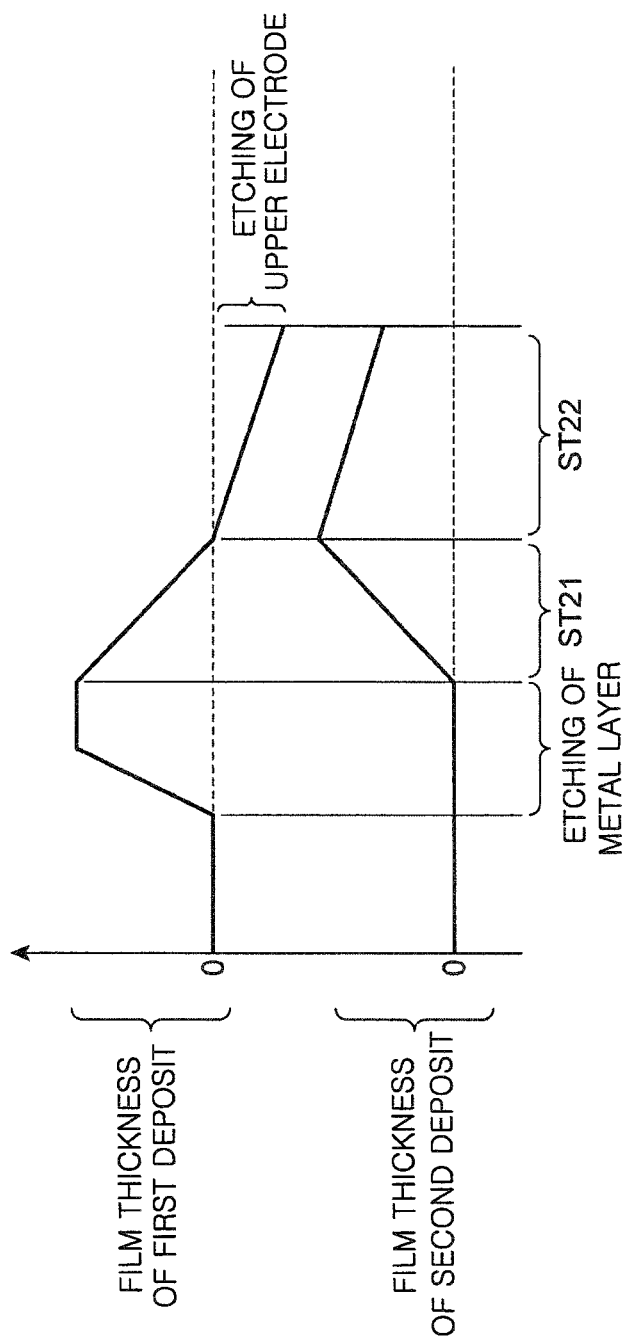

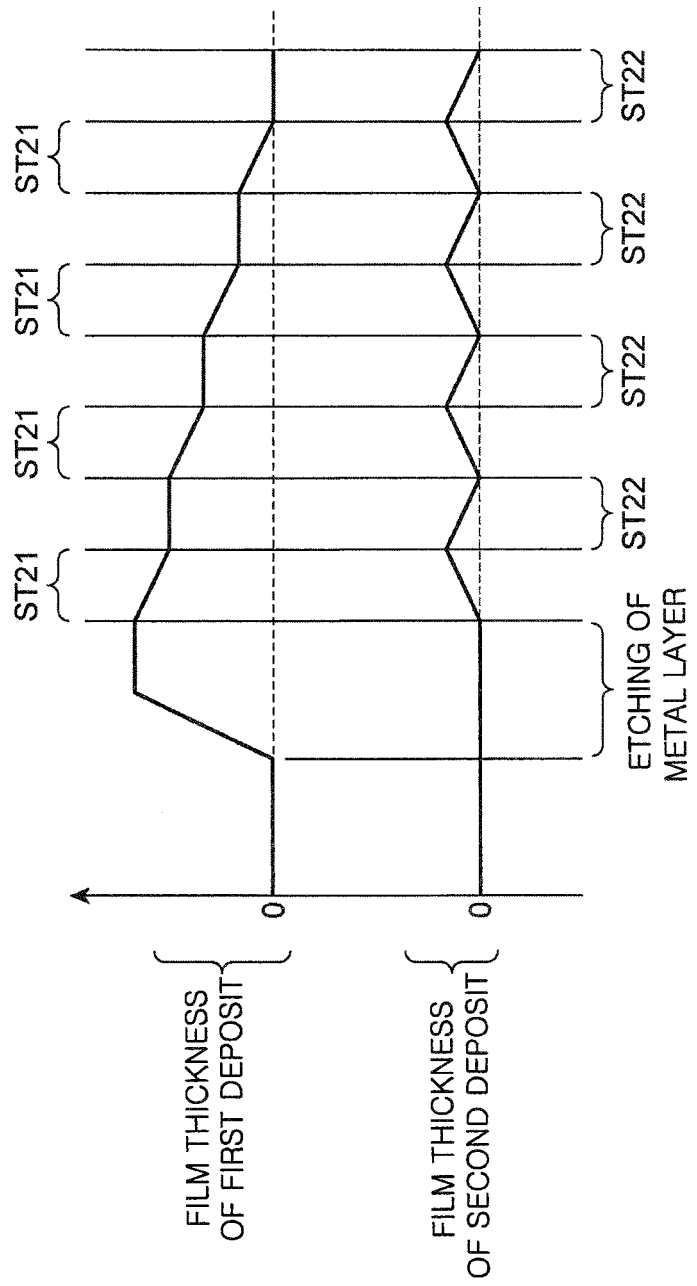

METHOD OF CLEANING PLASMA PROCESSING APPARATUS

CROSS-REFERENCE TO RELATED APPLICATIONS

This application claims priority to Japanese Patent Application No. 2014-040524 filed on Mar. 3, 2014, the entire contents of which are incorporated herein by reference.

FIELD OF THE INVENTION

The disclosure relates to a method of cleaning a plasma processing apparatus.

BACKGROUND OF THE INVENTION

In manufacturing electronic devices, plasma etching is performed on an etching target layer of a target object to be processed. A capacitively coupled parallel plate type plasma processing apparatus is known as a plasma processing apparatus for use in the plasma etching. The parallel plate type plasma processing apparatus includes a processing chamber, an upper electrode and a lower structure having a lower electrode. The target object is mounted on the lower structure so as to face a processing space in the processing chamber. In this plasma processing apparatus, a processing gas is supplied into the processing chamber and a high frequency power is applied to the upper electrode or the lower electrode. Thus, a plasma of the processing gas is generated in the processing space, and the target object, which is mounted on the lower structure so as to face the processing space, is etched by the plasma of the processing gas.

During the plasma etching process, an etching by-product generated due to the etching of the target object is formed as a deposit on surfaces defining an inner space of the processing chamber. The deposit may change the state in the plasma processing apparatus. Therefore, in the plasma processing apparatus, it is required to perform a cleaning for removing such deposit.

As a general cleaning method for removing a deposit generated in the plasma processing apparatus, there is provided a method of converting the deposit into a gaseous reaction by-product by causing chemical reaction on the deposit and exhausting the reaction by-product. The cleaning method using the chemical reaction may include a method of exhausting a reaction by-product by repeatedly performing oxidation reaction and reduction reaction on a deposit, e.g., a plasma polymer. Such method is disclosed in Japanese Patent Application Publication No. 1997-129623.

A semiconductor layer is generally used as the etching target layer to be subjected to the plasma etching. However, recently, the plasma etching is performed on a metal-containing layer. The metal-containing layer, i.e., a metal layer, may be a Cu layer, a PtMn layer or the like. The PtMn layer is used as a part of a magnetoresistive random access memory (MRAM) having a magnetic tunnel junction (MTJ) structure.

When the plasma etching is performed on the metal layer, e.g., the PtMn layer in the MRAM device, an etching by-product containing a metal is formed as a deposit on the surfaces defining the inner space of a processing chamber (hereinafter, referred to as "inner surfaces"). When the deposit is adhered to the inner surfaces, a plasma state in the processing chamber is changed and, thus, an etching rate of the plasma etching is changed. For example, in the parallel plate type plasma processing apparatus, a heavy metal contained in the etching by-product is moved toward an upper electrode by a sheath electric field generated near the target object. This metal is adhered to the upper electrode to form a deposit. The deposit adhered to the upper electrode generates a capacitance component, which leads to the change in impedance and the decrease in etching rate. Further, due to an etchant consumed by the deposit, the amount of the etchant supplied to the etching target layer becomes insufficient. As a result, the etching rate may further be decreased.

Therefore, it is necessary to remove the deposit containing the metal from the etching by-product (hereinafter, referred to as "metal deposit") because it changes the plasma state in the processing chamber. However, it is generally difficult to generate a gaseous reaction by-product by causing chemical reaction on the metal contained in the deposit and exhaust the gaseous reaction by-product. In other words, the metal contained in the deposit is mostly in a solid state even after the chemical reaction occurs. Therefore, the metal deposit cannot be removed by the general cleaning method.

The cleaning method using oxidation reaction and reduction reaction can remove only a metal having high ionization tendency, i.e., a metal that is easily ionized, e.g., K, Ca, Na or the like. This is because such a method using the oxidation reaction and the reduction reaction removes a deposit by weakening a binding force of the deposit. Therefore, in such a method, it is difficult to remove a deposit containing a chemically stable metal, i.e., a metal having low ionization tendency, or it takes a long period of time to remove such deposit.

In the parallel plate type plasma processing apparatus, a space where a plasma is generated (hereinafter, referred to as "plasma space") exists between the upper electrode and the lower electrode. Accordingly, although the metal deposit formed on the upper electrode can be removed from the upper electrode, a metal in the metal deposit is re-adhered to the lower electrode. This is because the heavy metal forming the deposit is rapidly moved toward the lower electrode opposite to the upper electrode without being removed from the plasma space by the sheath electric field generated between the plasma space and the electrodes. As a result, the metal is re-adhered to the lower structure or the target object mounted on the lower structure.

Therefore, there is required a technique for removing a deposit containing a metal having low ionization tendency, which is generated in a capacitively coupled parallel plate type plasma processing apparatus.

SUMMARY OF THE INVENTION

In accordance with an aspect, there is provided a cleaning method for removing a first deposit, formed on an upper electrode through an etching of a metal layer containing a metal in a processing chamber of a plasma processing apparatus, the method including: colliding ions with the first deposit formed on the upper electrode of the processing chamber; and removing a second deposit, which is generated by said colliding and formed on a lower structure of the processing chamber. A cycle including said colliding and said removing is repeated multiple times.

BRIEF DESCRIPTION OF THE DRAWINGS

The objects and features of the disclosure will become apparent from the following description of embodiments, given in conjunction with the accompanying drawings, in which:

FIGS. 17A and 17B are timing charts showing film thicknesses of a first deposit and a second deposit during execution of the cleaning method MT2.

DETAILED DESCRIPTION OF THE EMBODIMENTS

Figure 1:
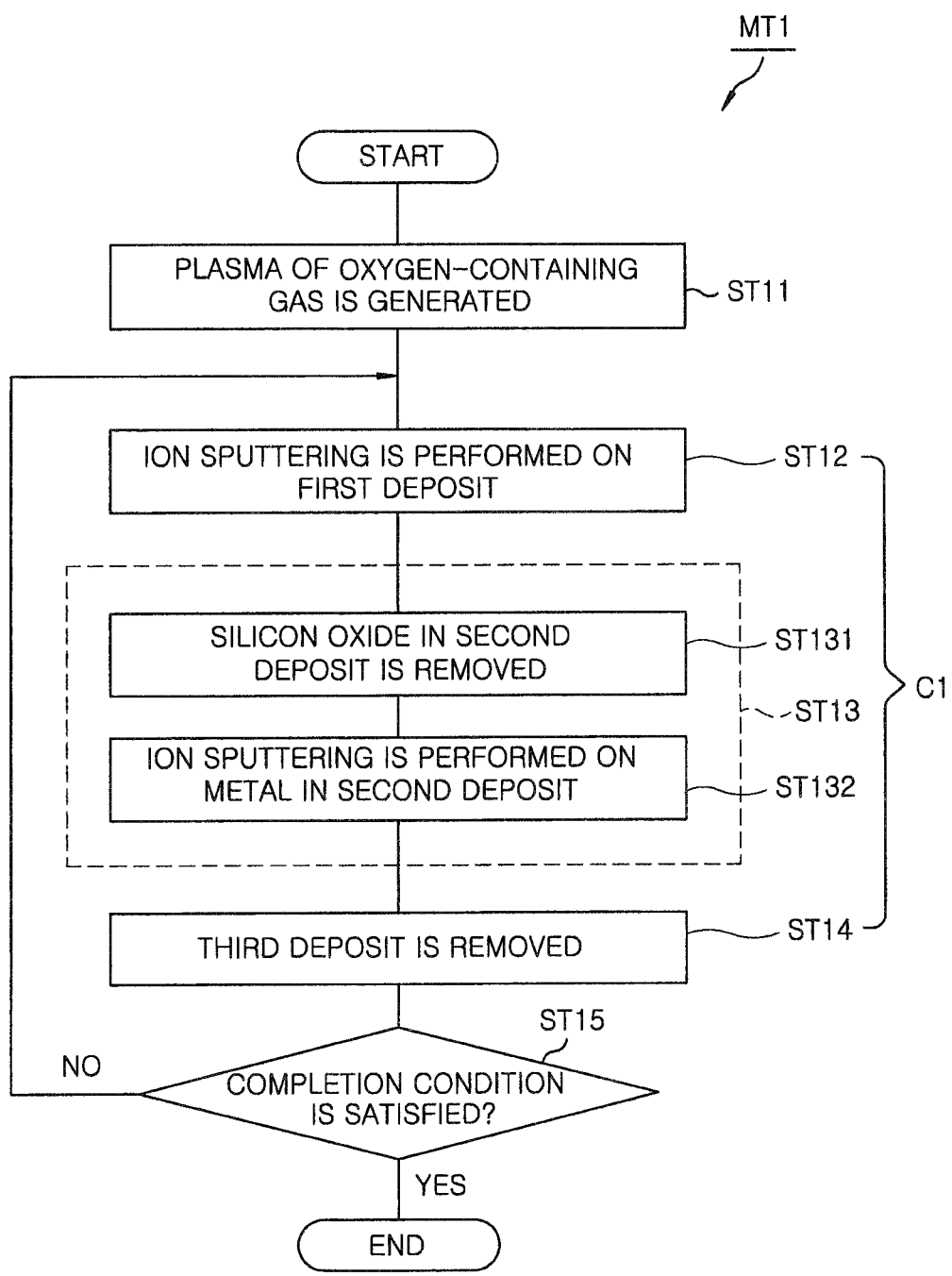
FIG. 1 is a flowchart of a cleaning method in accordance with an embodiment.

Hereinafter, embodiments will be described in detail with reference to the accompanying drawings. Further, like reference numerals will be given to like or corresponding parts in the respective drawings.

FIG. 1 is a flowchart showing a cleaning method in accordance with an embodiment. A cleaning method MT1 shown in FIG. 1 is a cleaning method for cleaning a capacitively coupled parallel plate type plasma processing apparatus. The cleaning method MT1 is a method for removing a metal deposit, which is adhered to an inner surface of a processing chamber of a plasma processing apparatus when etching a metal layer of a target object to be processed (hereinafter, referred to as "wafer") W.

In order to remove the metal deposit generated when etching the metal layer of the wafer W, which contains a metal having low ionization tendency and becomes a solid by-product after the etching (that is, it is difficult to oxidize such metal and also difficult to change such metal into a gas by chemical reaction), the cleaning method MT1 shown in FIG. 1 may be used to clean the inner surface of the plasma processing apparatus after the metal layer is etched. Such a metal is a so-called platinum group including, e.g., Pt, Ru, Au, Rh, Pd, Os, Ir, or the like. The metal layer is a metal layer that is a part of a magnetoresistive random access memory (MRAM) device having a magnetic tunnel junction (MTJ) structure, e.g., a PtMn layer.

Figure 2:
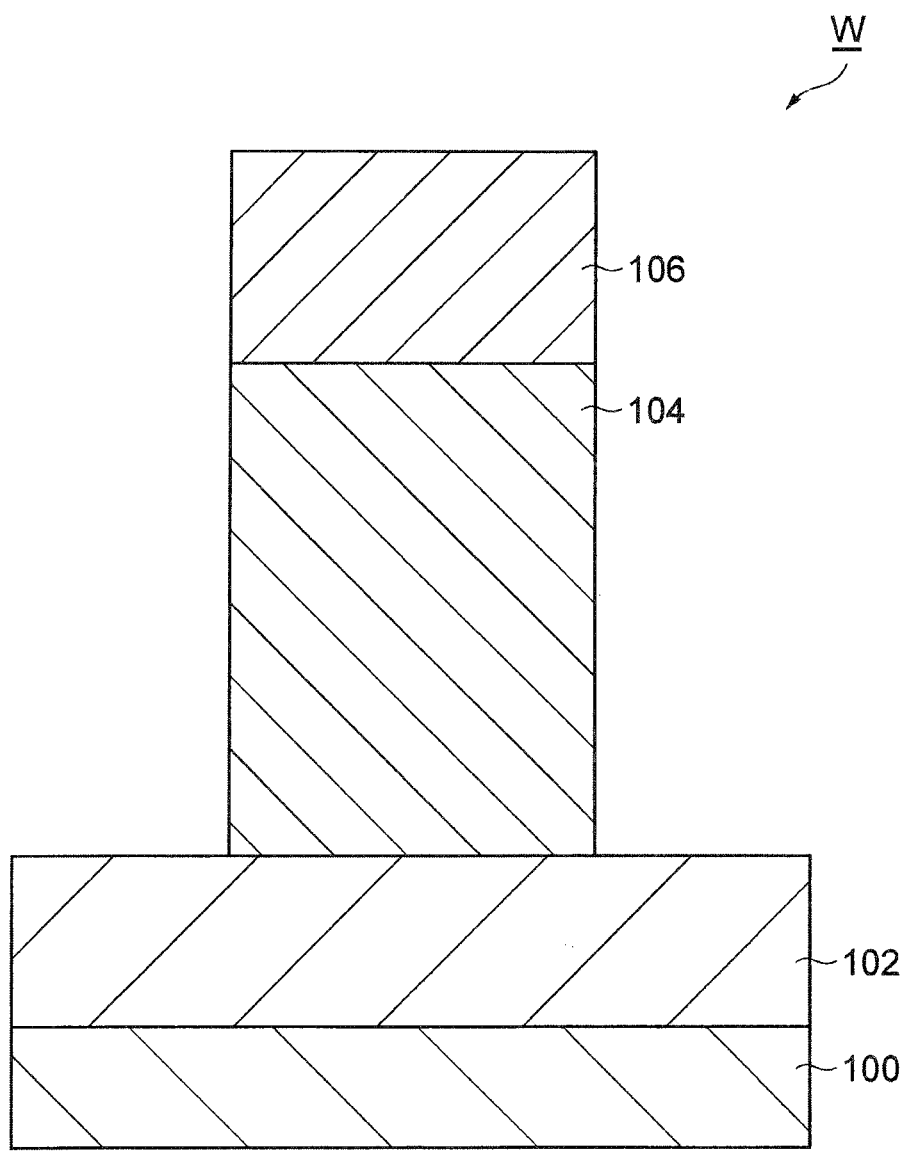
FIG. 2 is a cross sectional view showing an example of a target object to be processed.

FIG. 2 is a cross sectional view showing an example of the target object. Specifically, FIG. 2 shows a cross section of a product (target object) in the middle of manufacturing the MRAM device having a MTJ structure. The wafer W shown in FIG. 2 includes a base layer 100, a metal layer 102, a MTJ structure 104, and an upper layer 106. In this example, the base layer 100 serves as a lower electrode. The metal layer 102 serves as a pinning layer made of PtMn. The upper layer 106 contains Ta. The MTJ structure 104 is formed of a multilayer film containing a metal of a ferromagnetic substance. The MTJ structure 104 is formed by embedding an insulating layer between a first magnetic layer and a second magnetic layer, for example. The metal layer 102 of the wafer W may be etched while using as a mask the laminated structure including the upper layer 106 and the MTJ structure 104. The metal layer 102 is etched by generating, e.g., a plasma of a gas containing hydrogen, a rare gas and hydrocarbon in the parallel plate type plasma processing apparatus. For example, the metal layer 102 is etched by generating a plasma of $H_2$ gas, Ar gas, and $CH_4$ gas.

Figure 3:
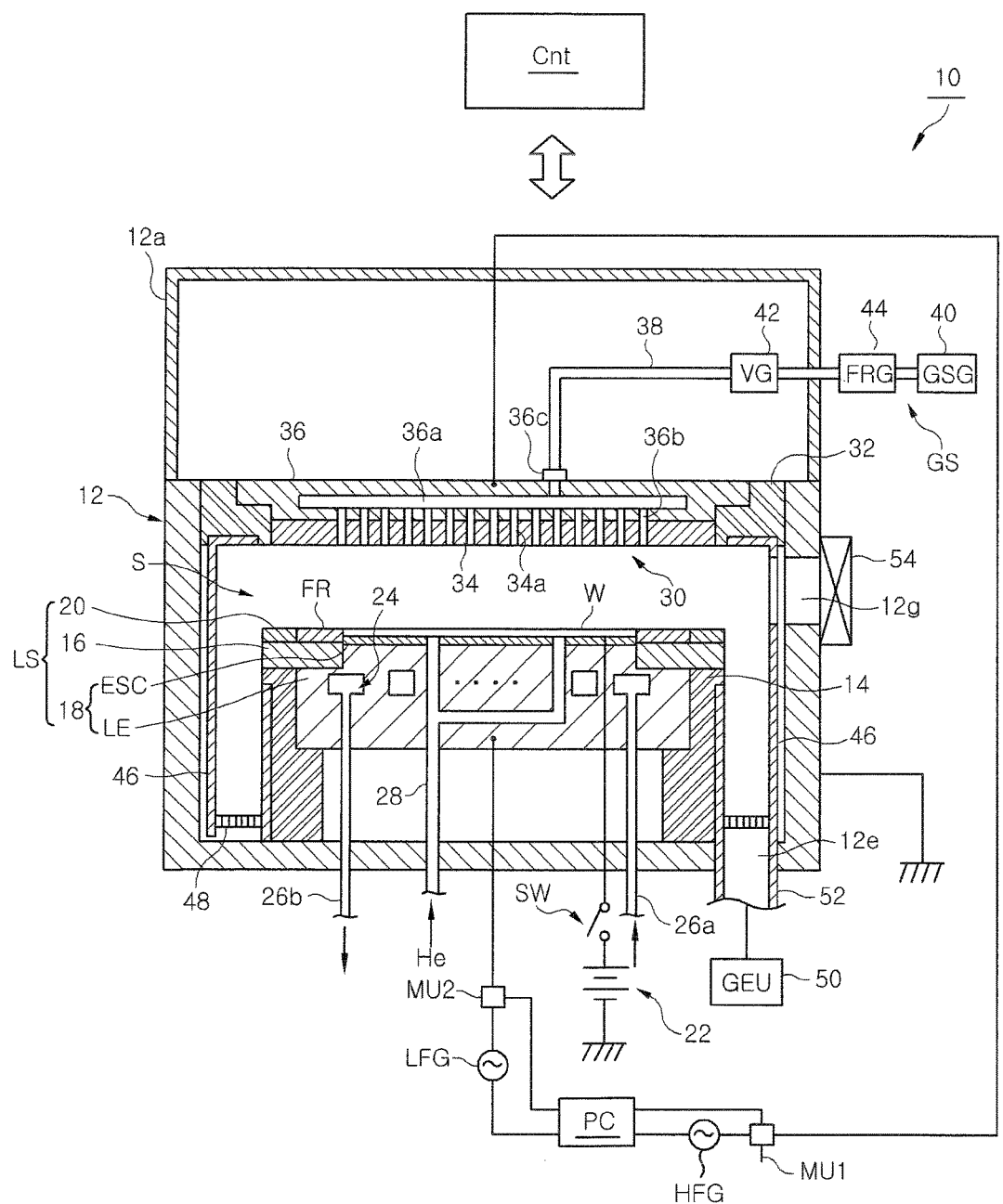
FIG. 3 shows a capacitively coupled parallel plate type plasma processing apparatus in accordance with the embodiment.

FIG. 3 shows the capacitively coupled parallel plate type plasma processing apparatus in accordance with the embodiment. The plasma processing apparatus 10 shown in FIG. 3 includes a substantially cylindrical processing chamber 12. An inner wall surface of the processing chamber 12 is made of anodically oxidized aluminum. The processing chamber 12 is frame grounded.

A lower structure LS is provided at a bottom portion of the processing chamber 12. The lower structure LS includes a supporting part 14, a mounting table 18, a spacer 16, an annular member 20, and a focus ring FR. The supporting part 14 is provided at the bottom portion of the processing chamber 12. The supporting part 14 may be made of an insulating material such as quartz. The supporting part 14 is provided in the processing chamber 12 and extends vertically from the bottom portion of the processing chamber 12. The supporting part 14 supports the mounting table 18.

The mounting table 18 includes a lower electrode LE and an electrostatic chuck ESC. The lower electrode LE is made of a metal, e.g., aluminum, and has a substantially disc shape. The electrostatic chuck ESC is provided on the lower electrode LE. The electrostatic chuck ESC has a structure in which an electrode made of a conductive film is embedded between two insulating layers or two insulating sheets. A DC power supply 22 is electrically connected to the electrode of the electrostatic chuck ESC via a switch SW. The wafer W can be attracted and held on the electrostatic chuck ESC by an electrostatic force such as a Coulomb force generated by a DC voltage applied from the DC power supply 22.

The spacer 16 is provided on a peripheral portion of the lower electrode LE. The spacer 16 has a substantially annular plate shape and is made of an insulator such as quartz. The annular member 20 is provided on a peripheral portion of the spacer 16. The annular member 20 has a substantially annular plate shape and is made of an insulator such as quartz. The focus ring FR is provided on the spacer 16 and between the annular member 20 and the wafer W. In other words, the focus ring FR surrounds the edge of the wafer W. The focus ring FR is provided to improve the in-plane uniformity of the etching. The focus ring FR is made of a material that is appropriately selected depending on a material of an etching target film. For example, the focus ring FR may be made of quartz.

A coolant path 24 is provided in the lower electrode LE. A coolant is supplied to the coolant path 24 from an external chiller unit through a line 26a. The coolant flowing in the coolant path 24 returns to the chiller unit through a line 26b. In the plasma processing apparatus 10, a temperature of the wafer W mounted on the mounting table can be controlled by controlling a temperature of the coolant.

The plasma processing apparatus 10 further includes a gas supply line 28. The gas supply line 28 supplies a heat transfer gas, e.g., He gas, from a heat transfer gas supply unit to a gap between a top surface of the electrostatic chuck ESC and a backside of the wafer W.

The upper electrode 30 is provided above the mounting table 18. The upper electrode 30 is provided above the mounting table 18 to face the mounting table 18. The upper electrode 30 and the lower electrode LE are approximately parallel to each other. Between the upper electrode 30 and the mounting table 18, a space S where plasma processing is performed on the wafer W is defined.

The upper electrode 30 is held at an upper portion of the processing chamber 12 through an insulating shield member 32. The upper electrode 30 may include a surface portion 34 and an electrode main body 36. The surface portion 34 is in contact with the space S and has a plurality of gas injection openings 34a. In the present embodiment, the surface portion 34 is made of silicon oxide.

The electrode main body 36 holds the surface portion and is made of a conductive material, e.g., aluminum. The electrode main body 36 may have a water cooling structure. A gas diffusion space 36a is provided in the electrode main body 36. A plurality of gas holes 36b communicating with the gas injection openings 34a extends downward from the gas diffusion space 36a. Further, the electrode main body 36 includes a gas inlet port 36c for guiding a processing gas into the gas diffusion space 36a. A gas supply line 38 is connected to the gas inlet port 36c. A gas source group 40 is connected to the gas supply line 38 through a valve group (VG) 42 and a flow rate controller group (FRG) 44.

A gas supply unit GS including the gas source group (GSG) 40, the valve group 42, and the flow rate controller group 44 can selectively supply a gas for etching a metal layer, a rare gas, oxygen gas ($O_2$ gas), and a fluorine-containing gas. The gas for etching the metal layer includes hydrogen, a rare gas and hydrocarbon and includes $H_2$ gas, Ar gas, and $CH_4$ gas for example. The rare gas may be Ar gas. The fluorine-containing gas may be $NF_3$ gas. Further, the fluorine-containing gas may contain Ar gas in addition to $NF_3$ gas.

The plasma processing apparatus 10 may further include a ground conductor 12a. The ground conductor 12a has a substantially cylindrical shape and extends upward from the sidewall of the processing chamber 12 to a position higher than the upper electrode 30.

In the plasma processing apparatus 10, a shield member 46 is detachably provided along the inner wall of the processing chamber 12. The shield member 46 is also provided at an outer periphery of the supporting part 14. The shield member 46 may be made of aluminum coated with ceramic such as $Y_2O_3$ or the like.

A gas exhaust plate 48 is provided between the supporting part 14 and the inner wall of the processing chamber 12. The gas exhaust plate 48 may be formed by coating aluminum with ceramic, e.g., $Y_2O_3$ or the like. A gas exhaust port 12e is provided below the gas exhaust plate 48. A gas exhaust unit (GEU) 50 is connected to the gas exhaust port 12e through a gas exhaust line 52. The gas exhaust unit 50 has a vacuum pump such as a turbo molecular pump or the like, so that a pressure in the space S in the processing chamber 12 can be decreased to a predetermined vacuum level. A loading/unloading port 12g for the wafer W is provided at the sidewall of the processing chamber 12. The loading/unloading port 12g can be opened and closed by a gate valve 54.

The plasma processing apparatus 10 may further include a high frequency power supply HFG, a matching unit MU1, a high frequency power supply LFG, a matching unit MU2, and a power control unit PC. The high frequency power supply HFG generates a first high frequency power for plasma generation. The first high frequency power has a frequency in a range from 27 MHz to 100 MHz and is 60 MHz in this example. The high frequency power supply HFG is connected to the upper electrode 30 via a matching unit MU1.

The high frequency power supply LFG generates a second high frequency power for ion attraction, i.e., a high frequency bias power. The second high frequency power has a frequency in a range from 400 kHz to 13.56 MHz and is 400 kHz in this example. The second high frequency power supply LFG is connected to the lower electrode LE via a matching unit MU2.

The high frequency power supply HFG, the matching unit MU1, the high frequency power supply LFG, and the matching unit MU2 are connected to the power control unit PC. The power control unit PC controls the first high frequency power and the second high frequency power and frequencies thereof, and impedance matching operations of the matching units MU1 and MU2.

The plasma processing apparatus 10 may further include a control unit Cnt. The control unit Cnt is a computer including a processor, a storage unit, an input device, a display device and the like. The control unit Cnt controls the respective components of the plasma processing apparatus 10, e.g., a power supply system, a gas supply system, a driving system, a power system PS and the like. The control unit Cnt can allow an operator to input commands to manage the plasma processing apparatus 10 by using the input device and display the operation state of the plasma processing apparatus 10 on the display device. The storage unit of the control unit Cnt stores therein a control program for controlling various processes performed in the plasma processing apparatus 10, and a program, i.e., a processing recipe, for performing processes of the respective components of the plasma processing apparatus 10 based on the processing conditions.

Referring back to FIG. 1, the cleaning method MT1 will be described hereinafter. In the following description, the cleaning method MT1 is applied to the case of cleaning an inner surface of the plasma processing apparatus 10 after a PtMn layer as a metal layer is etched in the plasma processing apparatus 10. FIGS. 4 to 9 will be appropriately referred to in the following description. Each of FIGS. 4 to 9 is an enlarged cross sectional view showing the state of the plasma processing apparatus 10 after each step of the cleaning method MT1.

Before the cleaning method MT1 is executed, the metal layer is etched in the plasma processing apparatus 10. When the metal layer is etched, a plasma of a gas containing hydrogen, a rare gas, and hydrocarbon, e.g., a plasma of $H_2$ gas, Ar gas, and $CH_4$ gas, is generated in the processing chamber 12. The metal layer is etched by collision with ions in the plasma thus generated. $CH_4$ gas is mainly used for forming a protective film. The protective film is formed on a sidewall of a shape formed by etching the metal layer in order to ensure verticality of the corresponding shape.

Due to the etching of the metal layer, the metal, e.g., PtMn, in the metal layer is etched (scattered) from the metal layer. The etched (scattered) metal attains kinetic energy by the sheath electric field generated near the wafer W, thereby moving toward the upper electrode 30. Accordingly, the metal in the metal layer is adhered to the surface of the surface portion 34 of the upper electrode 30, thereby forming a first deposit DP1 (metal deposit) thereon. Although the first deposit DP1 having a uniform thickness is illustrated in FIG. 4, the thickness of the first deposit DP1 varies depending on positions and the surface portion 34 may be partially exposed to the space S.

Figure 4:
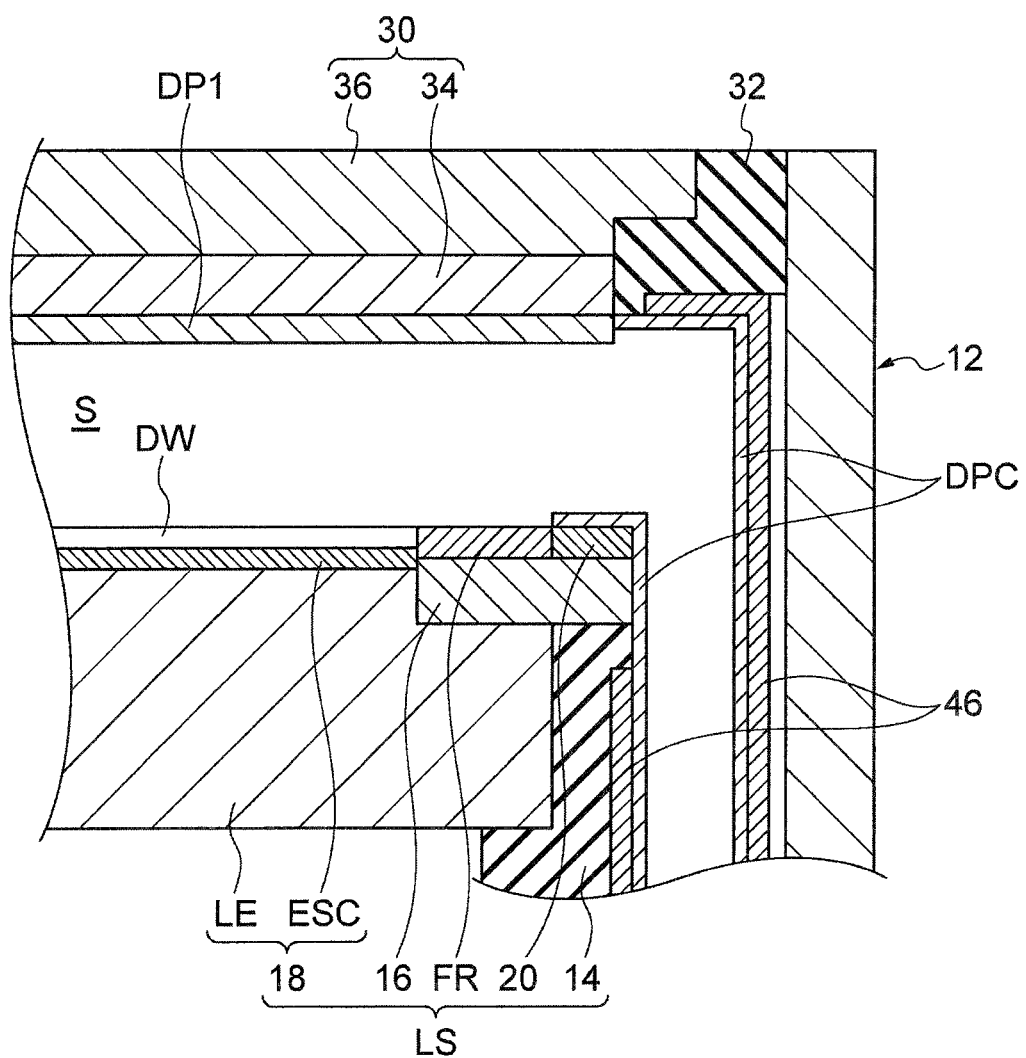
FIGS. 4 to 9 are enlarged cross sectional views each showing a state of a plasma processing apparatus 10 after each step of a cleaning method MT1.

As shown in FIG. 4, a carbon-containing deposit DPC is formed on a surface of the lower structure LS opposite to the sidewall of the processing chamber 12 and on a surface of the shield member 46. The deposit DPC is generated from the $CH_4$ gas. The cleaning method MT1 removes the first deposit DP1 and the deposit DPC. Therefore, in the cleaning method MT1, the wafer W is first unloaded and, then, a dummy wafer DW is mounted on the mounting table 18 as shown in FIG. 4. The dummy wafer DW may be a silicon substrate.

Figure 5:
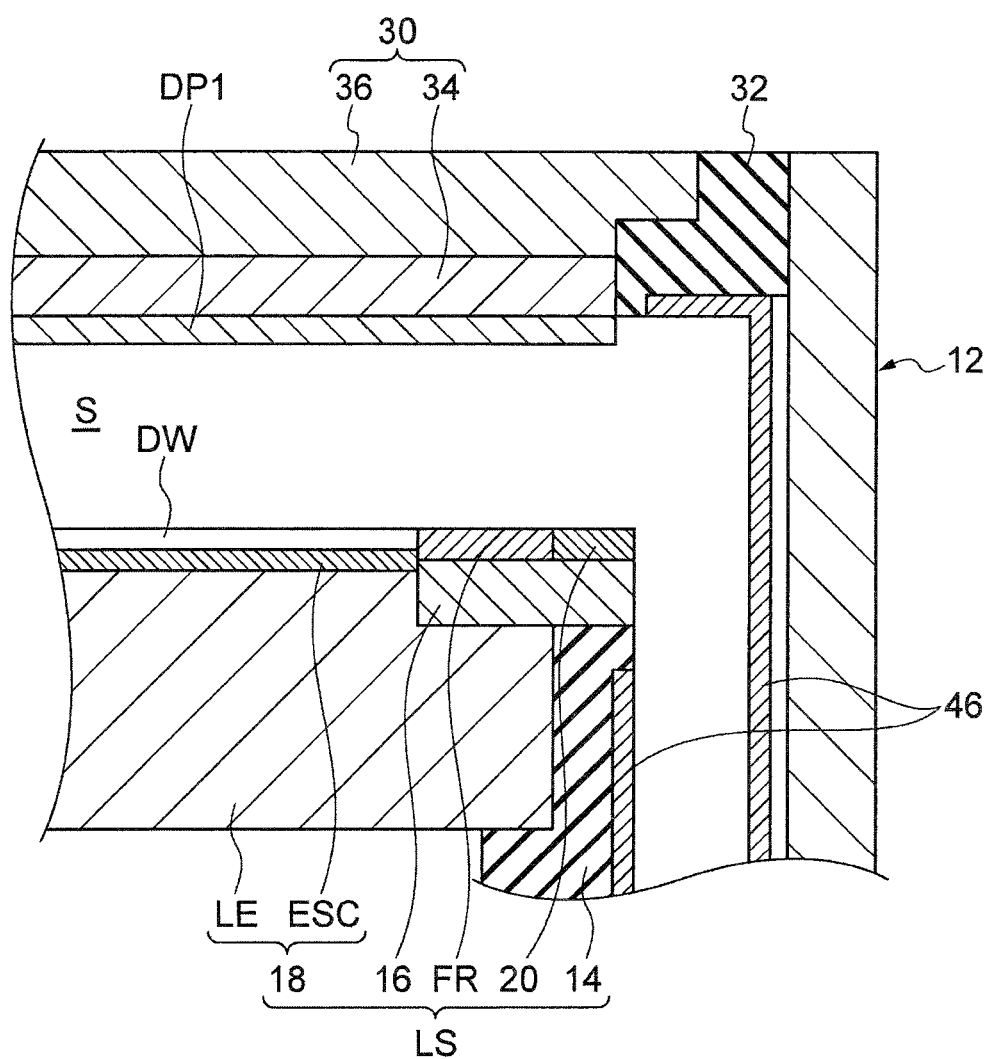

Next, a step ST11 of the cleaning method MT1 is executed. In the step ST11, a plasma of an oxygen-containing gas is generated in the processing chamber 12. By executing the step ST11, the carbon-containing deposit DPC is removed as shown in FIG. 5. When the metal layer contains a metal having low ionization tendency, the step ST11 can be executed before or after a cycle C1 to be described later is repeated multiple times. When the metal layer contains metal having high ionization tendency, i.e., the metal, which is relatively easily reacts but is difficult to be changed into a gas by chemical reaction, the step ST11 may be executed after the cycle C1 to be described later is repeated multiple times. This is because such metal is oxidized and changed to a hardly removable state when the step ST11 is executed before the cycle C1. The metal having high ionization tendency may contain at least one of Cu, Co, Fe, and Mg, for example.

Thereafter, the cycle C1 is repeated. The cycle C1 includes a step ST12, a step ST13, and a step ST14. In the step ST12, ion sputtering is performed on the first deposit DP1. In the step ST12, a plasma of a rare gas is generated in the processing chamber 12. The rare gas may be Ar gas. In the step ST12, the first high frequency power applied to the upper electrode and the second high frequency power applied to the lower electrode LE, i.e., the high frequency bias power, are set such that ions of the rare gas atoms are accelerated toward the upper electrode 30. Specifically, in the step ST12, the first high frequency power is set to be greater than the second high frequency power.

Further, in the step ST12, a plasma of a gas containing hydrogen and/or helium, e.g., a plasma of $H_2$ gas and/or He gas, may be generated in addition to the plasma of the rare gas. In the case of using the plasma of the gas containing hydrogen and/or helium, the chemical element having a size sufficiently smaller than the bonding length of the deposit can be put into the bonding of the deposit. Hence, the bonding state of the first deposit DP1 can be changed. As a result, the surface state of the first deposit DP1 can be modified, which makes it possible to more easily remove the first deposit DP1.

Figure 6:
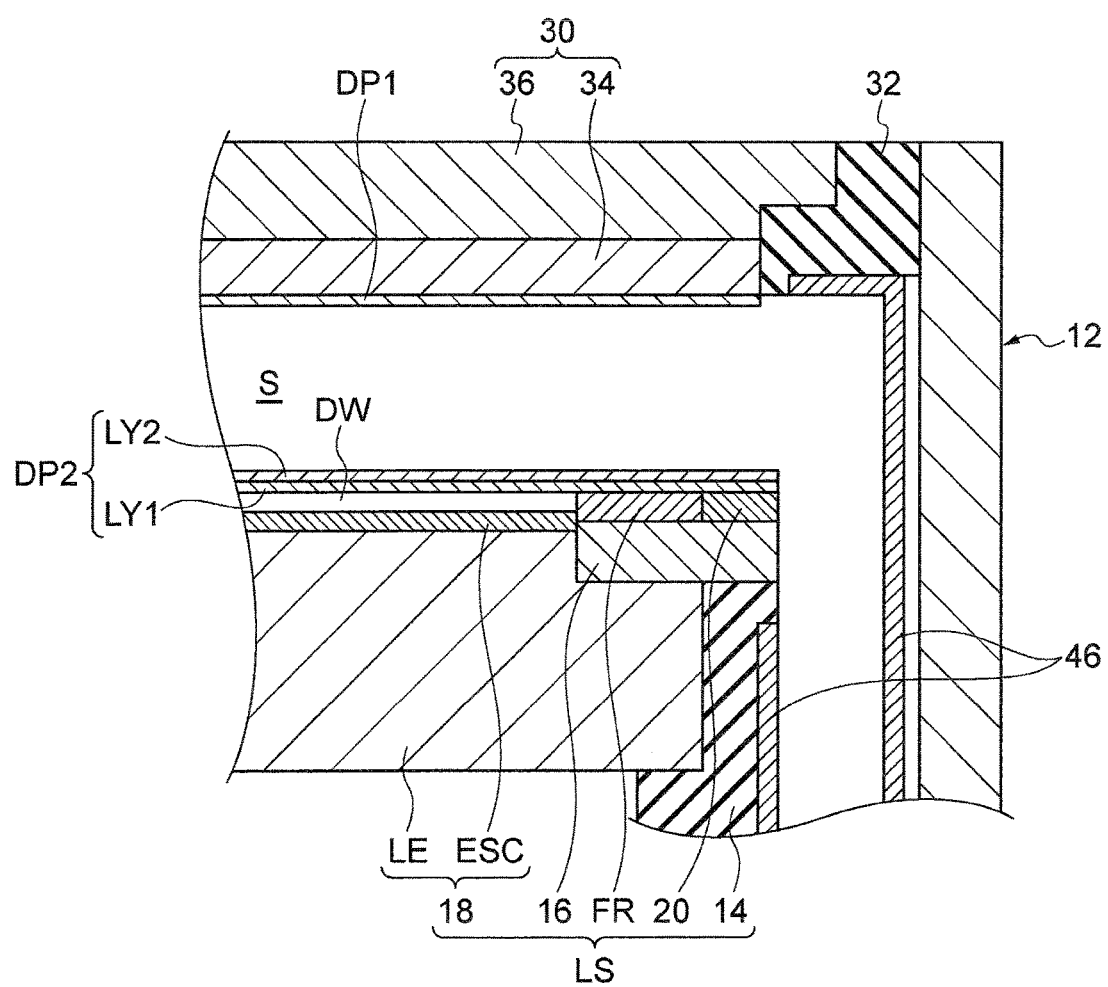

In the step ST12, ions of the rare gas atoms collide with the first deposit DP1. Hence, the metal in the first deposit DP1, e.g., PtMn, is sputtered from the first deposit DP1. Further, in the step ST12, the silicon oxide in the surface portion 34 is sputtered. The metal sputtered from the first deposit DP1 and the silicon oxide sputtered from the surface portion 34 are adhered to the surface of the lower structure LS. Accordingly, a second deposit DP2 is formed on the lower structure LS as shown in FIG. 6.

The amount of the metal contained in the second deposit DP2 becomes greater at portion closer to the lower structure LS and the amount of the silicon oxide contained in the second deposit DP2 becomes greater at a portion farther from the lower structure LS2. For example, the second deposit DP2 is a multilayer film having a first layer LY1 and a second layer LY2 as shown in FIG. 6. The first layer LY1 is deposited on the lower structure LS and mainly contains a metal, e.g., PtMn. The second layer LY2 is formed on the first layer LY1 and mainly contains silicon oxide. The second deposit DP2 may not be a multilayer film separated into two layers shown in FIG. 6. For example, the second deposit DP2 may be a film in which a metal and a silicon oxide are mixed or may be a film in which the amount of the metal and the amount of the silicon oxide contained therein vary in a film thickness direction.

Further, the first deposit DP1 is mostly deposited on the center portion of the surface portion 34 of the upper electrode 30. This is because the etching by-product formed at a portion closer to the center portion of the surface portion 34 is difficult to be exhausted during the etching. At the peripheral portion outward of the center portion of the surface portion 34, some of the etching by-products are exhausted and some of the etching by-products from the first deposit DP1. Therefore, the thinner first deposit DP1 is formed at the peripheral portion of the surface portion 34 of the upper electrode 30.

Next, the step ST13 of the cleaning method MT1 is executed. In the step ST13, the second deposit DP2 is removed. Specifically, the step ST13 of the cleaning method MT1 includes a step ST131 and a step ST132.

Figure 7:
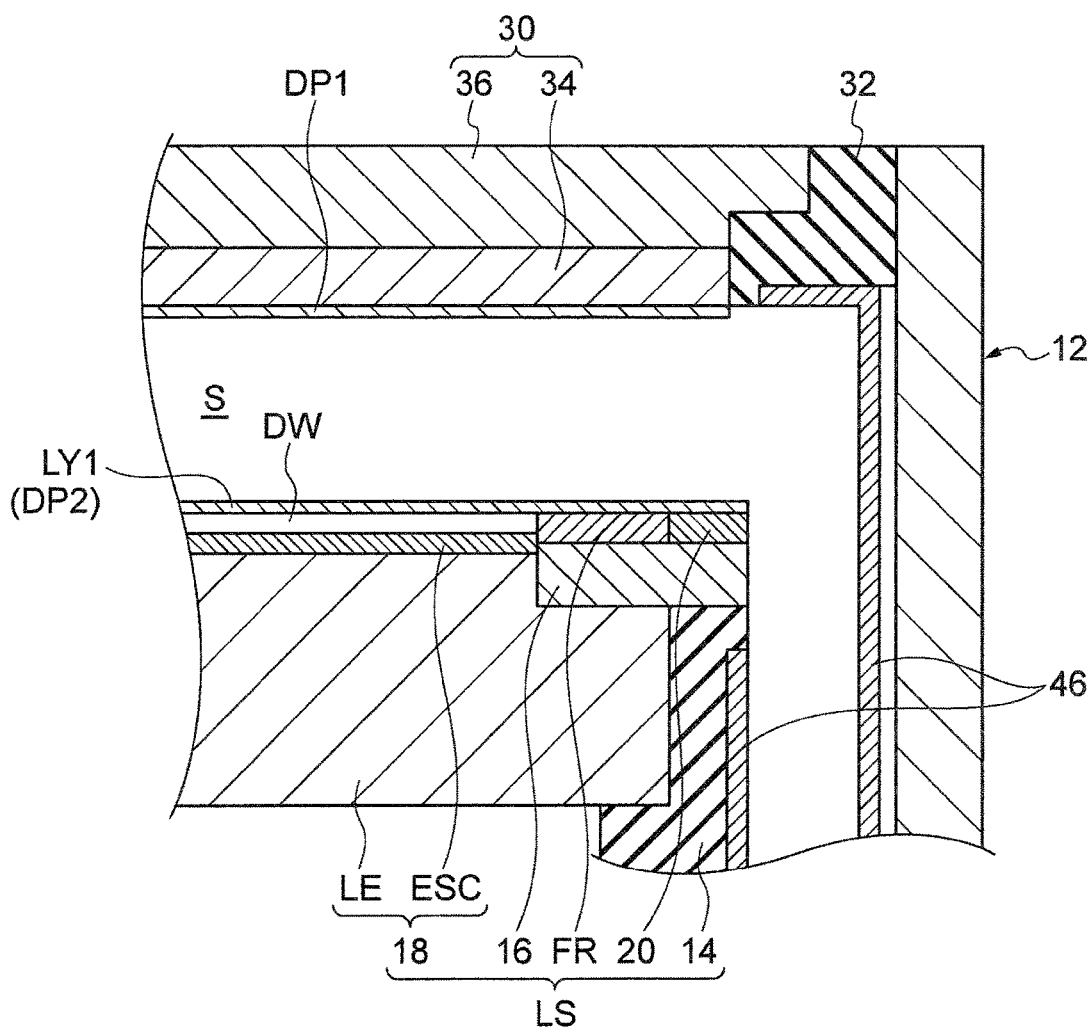

In the step ST131, the silicon oxide in the second deposit DP2 is removed. Specifically, a plasma of a fluorine-containing gas is generated in the processing chamber 12. The fluorine-containing gas may be, e.g., $NF_3$ gas, and may further contain a rare gas such as Ar gas. By executing the step ST131, the silicon oxide in the second deposit DP2 is removed as shown in FIG. 7. In FIG. 7, there is illustrated a state in which the second layer LY2 mainly containing the silicon oxide is removed while the first layer LY1 mainly containing the metal remains.

Next, in the step ST132, the metal in the second deposit DP2, e.g., PtMn, is removed. In the step ST132, ion sputtering is performed on the metal in the second deposit DP2. In the step ST132, a plasma of a rare gas is generated in the processing chamber 12. The rare gas may be Ar gas. In the step ST132, the first high frequency power applied to the upper electrode and the second high frequency power applied to the lower electrode LE, i.e., a high frequency bias power, are set such that the ions of the rare gas atoms are accelerated toward the lower structure LS. Specifically, in the step ST132, the second high frequency power is set to be greater than the first high frequency power. Accordingly, the ions of the rare gas atoms are accelerated toward the lower structure LS.

Figure 8:
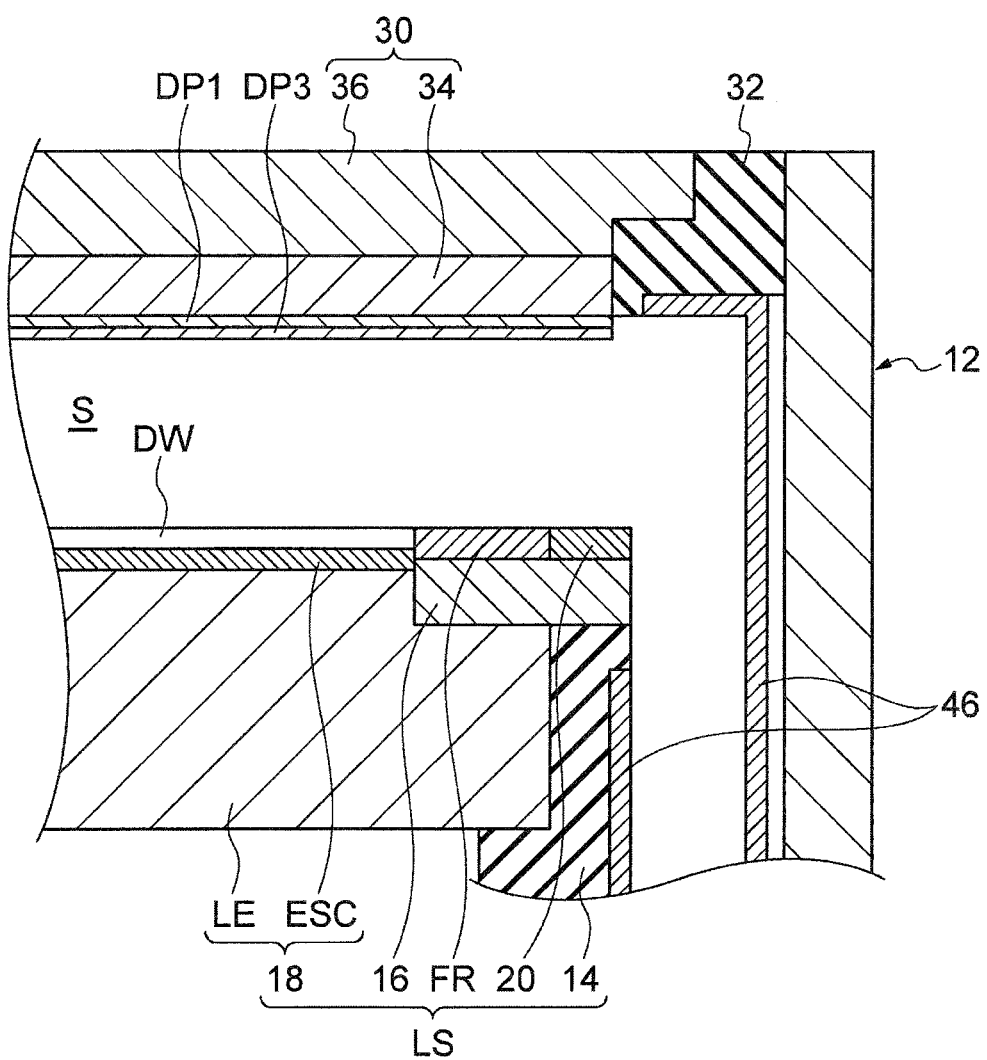

In the step ST132, the ions of the rare gas atoms collide with the second deposit DP2. Accordingly, as shown in FIG. 8, the metal in the second deposit DP2, e.g., PtMn, is sputtered from the second deposit DP2 and, thus, the second deposit DP2 on the lower structure LS is at least partially removed.

In the step ST13, the metal and the silicon oxide in the second deposit DP2 are etched as described above. Further, in the step ST13, silicon in the dummy wafer DW is also etched. The second deposit DP2 or the substance etched from the dummy wafer DW is exhausted when it is moved in a gas exhaust direction to the outside of the plasma space. However, the substance existing in a position far from the boundary of the plasma space, e.g., the substance etched from the dummy wafer DW, may be accelerated toward the upper electrode 30 before it is moved to the outside of the plasma space. Therefore, the substance etched in the step ST13 is partially re-adhered to the surface of the upper electrode 30. In other words, after the execution of the step ST13, the metal, the silicon oxide, and the silicon are adhered to the surface of the surface portion 34 of the upper electrode 30 or the surface of the first deposit DP1 remaining after the execution of the step ST11, as shown in FIG. 8. As a consequence, a third deposit DP3 is formed.

Figure 9:
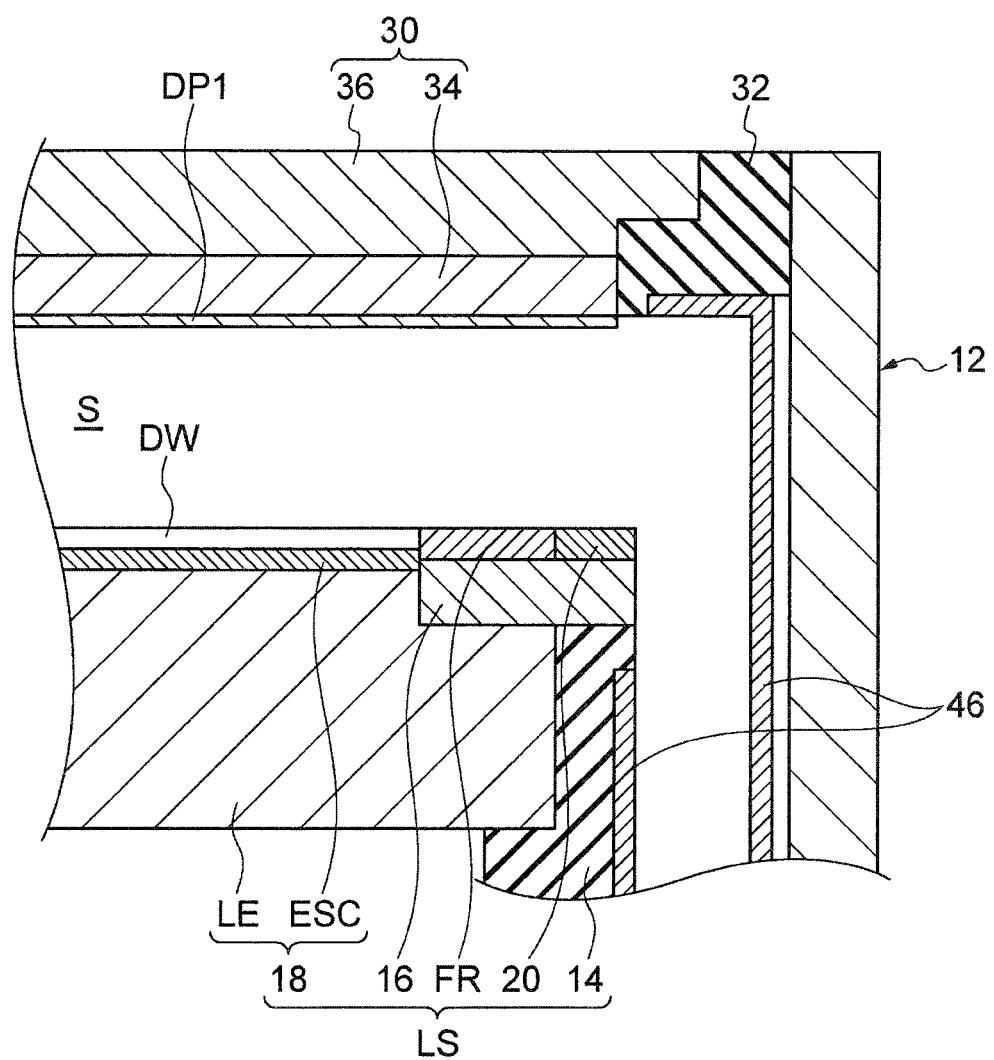

Next, in the cleaning method MT1, a step ST14 for removing the third deposit DP3 is executed. In the step ST14, a plasma of a fluorine-containing gas is generated in the processing chamber 12. The fluorine-containing gas may be, e.g., $NF_3$ gas, and may further contain a rare gas such as Ar gas. By executing the step ST14, the third deposit DP3 is removed as shown in FIG. 9.

Next, in a step ST15 of the cleaning method MT1, it is determined whether or not a completion condition is satisfied. The completion condition is used to determine the completion of repetition of the cycle C1. For example, the completion condition is satisfied when the cycle C1 is repeated a predetermined number of times. Alternatively, the completion of repetition of the cycle C1 may be determined by an end point detection technique.

If it is determined in the step ST15 that the completion condition is not satisfied, the cycle C1 is executed again. On the contrary, if it is determined in the step ST15 that the completion condition is satisfied, the entire steps of the cleaning method MT1 are completed.

With this cleaning method MT1, the first deposit DP1 containing a metal, which is formed on the upper electrode 30, can be removed from the processing chamber 12 by gradually exhausting the first deposit DP1 to the outside of the plasma space by repeating the cycle C1 multiple times. In other words, with the cleaning method MT1, the first deposit DP1 can be removed from the processing chamber 12 by repeating the ion sputtering with respect to the first deposit DP1 and the removal of the second deposit DP1 generated by the ion sputtering.

Hereinafter, there will be described test examples that have been conducted by using the plasma processing apparatus 10 to examine the cleaning method MT1.

Test Examples 1 and 2

In test examples 1 and 2, a PtMn layer was etched by using the plasma processing apparatus 10 in a state where a silicon chip, i.e., a small segment, was attached to the surface of the upper electrode 30. In etching the PtMn layer, a plasma of $H_2$ gas, Ar gas, and $CH_4$ gas was generated in the processing chamber 12 of the plasma processing apparatus 10. Thereafter, in the test example 1, the cleaning method MT1 was performed. The conditions for the respective steps of the cleaning method MT1 in the test example 1 were set as follows. In the test example 1, the cycle C1 was repeated five times. On the other hand, in the test example 2, the cleaning method MT1 was not performed after the etching of the PtMn layer.

Figure 10A:
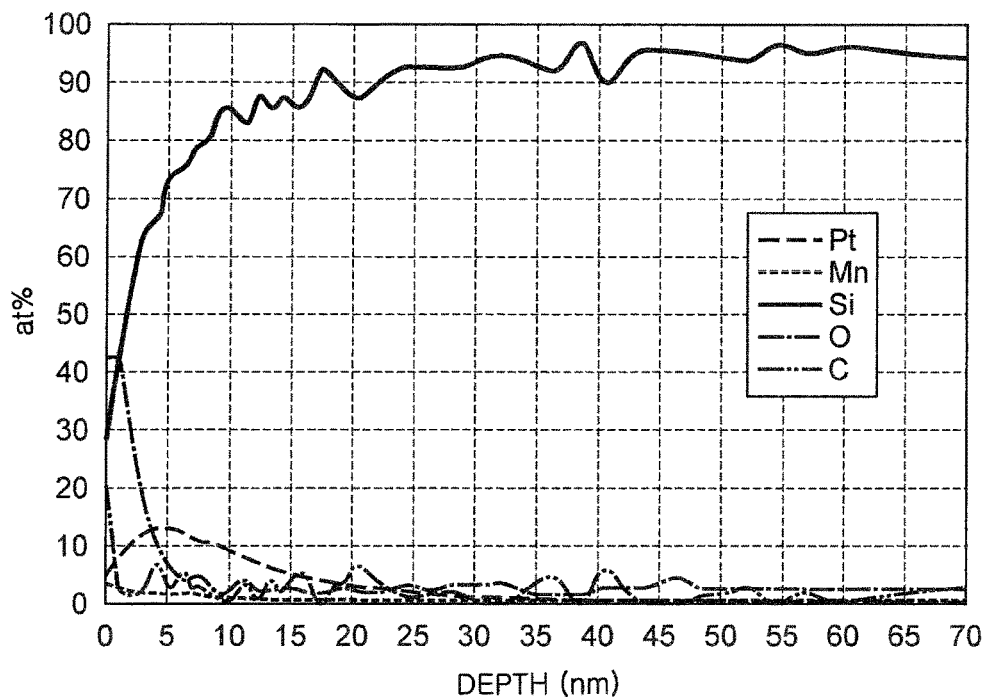
FIGS. 10A and 10B show results of test examples 1 and 2.
Figure 10B:
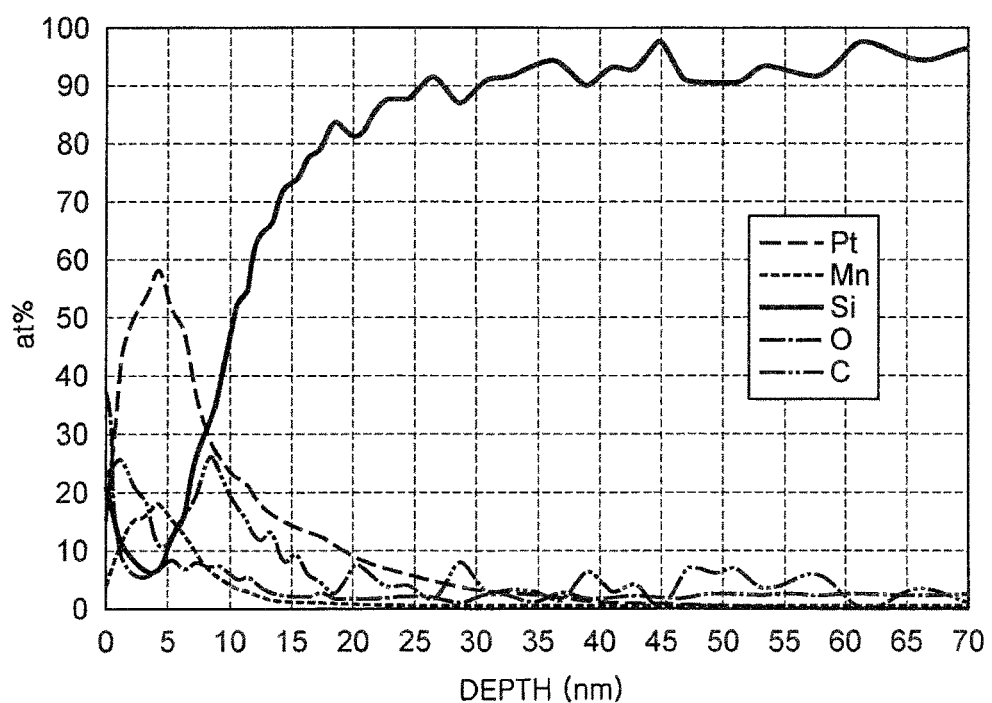

<Step ST11>
Pressure in processing chamber: 30 mTorr (4 Pa)
$O_2$ gas: 500 sccm
First high frequency power: 1000 W
Second high frequency power: 500 W
Processing time: 45 sec
<Step ST12>
Pressure in processing chamber: 15 mTorr (2 Pa)
Ar gas: 300 sccm
First high frequency power: 1000 W
Second high frequency power: 200 W
Processing time: 12 sec
<Step ST131>
Pressure in processing chamber: 15 mTorr (2 Pa)
$NF_3$ gas: 120 sccm
Ar gas: 100 sccm
First high frequency power: 1000 W
Second high frequency power: 200 W
Processing time: 7 sec
<Step ST132>
Pressure in processing chamber: 15 mTorr (2 Pa)
Ar gas: 300 sccm
First high frequency power: 600 W
Second high frequency power: 1000 W
Processing time: 15 sec
<Step ST14>
Pressure in processing chamber: 15 mTorr (2 Pa)
$NF_3$ gas: 120 sccm
Ar gas: 100 sccm
First high frequency power: 600 W
Second high frequency power: 100 W
Processing time: 6 sec In each of the test examples 1 and 2, the composition of the processed chip was measured by X-ray photoelectron spectroscopy (XPS). FIGS. 10A and 10B show results of the test examples 1 and 2. FIG. 10A is a graph showing the composition of the chip in the test example 1. FIG. 10B is a graph showing the composition of the chip in the test example 2. In the graphs shown in FIGS. 10A and 10B, the horizontal axis represents a depth (nm) from the surface of the deposit or the chip. The depth is calculated as a depth of a $SiO_2$ thermal oxide film. The vertical axis represents atom concentration (at %).

As shown in FIG. 10B, in the processed chip of the test example 2, a large amount of Pt and Mn was detected at a region with a small depth in a depth direction. In other words, it was found that the first deposit containing PtMn was formed on the surface of the upper electrode 30 by the etching of the PtMn layer. On the contrary, as shown in FIG. 10A, it was found that most of Pt and Mn were removed from the surface of the chip by performing the cleaning method MT1 after the etching of the PtMn layer as can be seen from FIG. 10A. Specifically, it was found from the comparison between the composition of the processed chip of the test example 1 and the composition of the processed chip of the test example 2 that about 90% of Pt and Mn were removed by performing the cleaning method MT1.

Test Examples 3 and 4

In the test example 3, etching was performed under the following chamber-condition check condition (CCC condition) in the case of performing the cleaning method MT1 after the etching of the PtMn layer. In the test example 4, etching was performed under the same CCC condition as that of the test example 3 without performing the cleaning method MT1 after the etching of the PtMn layer. The conditions for the respective steps of the cleaning method MT1 were the same as those in the test example 1.

<CCC Condition>
Pressure in processing chamber: 15 mTorr (2 Pa)
$H_2$ gas: 300 sccm
$N_2$ gas: 100 sccm
First high frequency power: 600 W
Second high frequency power: 100 W
Processing time: 60 sec
Etching target: photoresist film (wafer having ArF resist film)

The etching rates under the CCC condition in the test examples 3 and 4 were measured. In the etching under the CCC condition, the etching rate is decreased by consumption of an etchant and generation of a capacitance component due to a metal deposit (metal having low ionization tendency, e.g., Pt or the like) and is increased by removing the metal deposit, as in the etching under the processing conditions for a metal film that can be etched by chemical reaction (a metal film that can be etched by a plasma of a fluorine-containing gas, e.g., a Ta film or the like). Therefore, the etching under the CCC condition is related to the etching of the metal film (e.g., a Ta film). Accordingly, in the test examples 3 and 4, the etching rate recovery effect by performing the cleaning method MT1 was proved by the comparison of the etching under the CCC condition with the cleaning method MT1 after the etching of the PtMn layer and the etching under the CCC condition without the cleaning method MT1.

Figure 11:
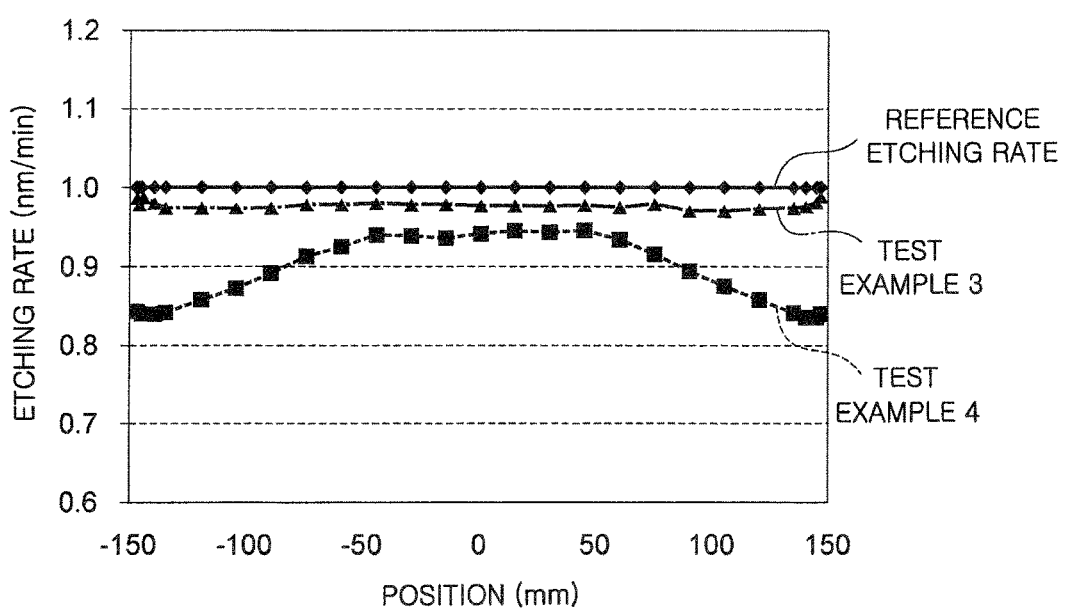
FIG. 11 shows results of test examples 3 and 4.

FIG. 11 shows the etching rates under the CCC condition in the test examples 3 and 4. In the graph shown in FIG. 11, the horizontal axis represents a position in a diametrical direction of a wafer having a PtMn layer. A center position of the wafer is indicated by "0". The vertical axis represents an etching rate. Further, in the graph shown in FIG. 11, the etching rate under the CCC condition before the etching of the PtMn layer is illustrated as the reference etching rate. The reference etching rate is normalized as "1". The etching rates of the test examples 3 and 4 are normalized based on the reference etching rate. As shown in FIG. 11, in the case of not performing the cleaning method MT1 after the etching of the PtMn layer, i.e., in the test example 4, the etching rate under the CCC condition was considerably decreased. On the other hand, in the case of performing the cleaning method MT1 after the etching of the PtMn layer, i.e., in the test example 3, the etching rate under the CCC condition was substantially the same as the reference etching rate. Therefore, it was found that the cleaning method MT1 can remove the deposit generated by etching the PtMn layer and recover the condition of the plasma processing apparatus 10.

Figure 12:
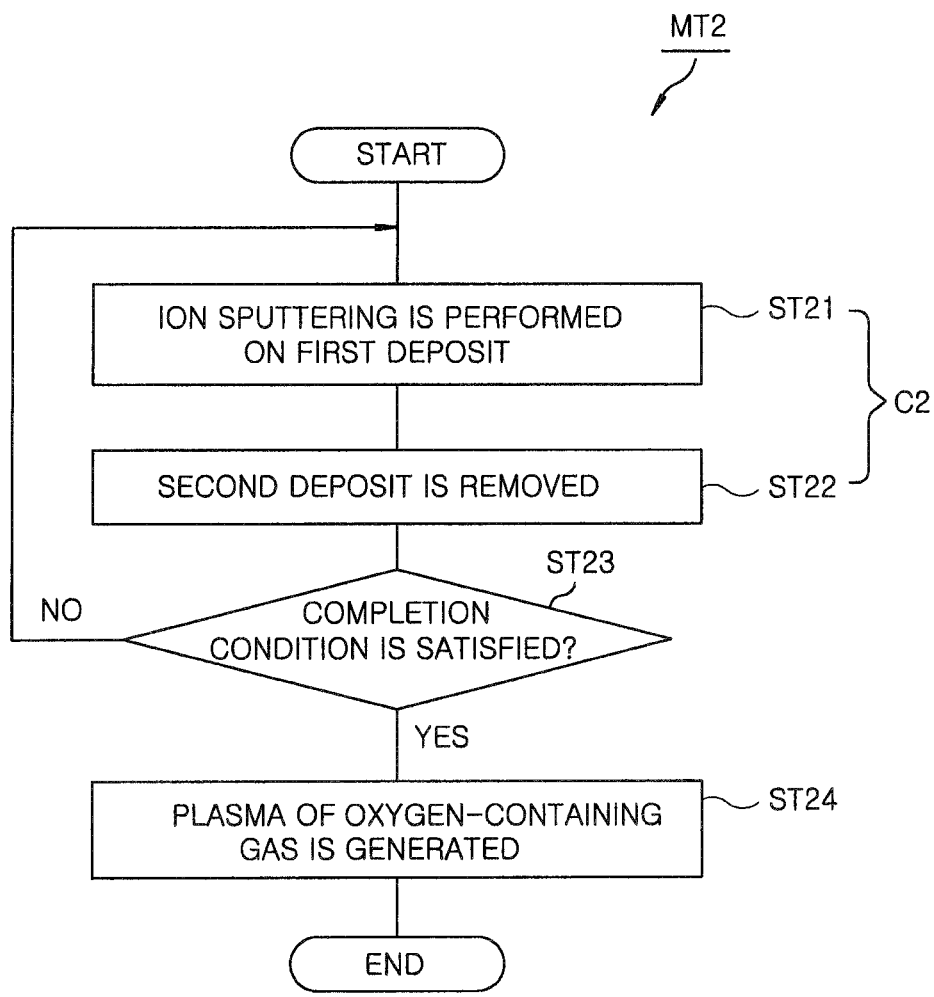
FIG. 12 is a flowchart of a cleaning method in accordance with another embodiment.

Hereinafter, there will be described another embodiment. FIG. 12 is a flowchart showing a cleaning method in accordance with another embodiment. In a cleaning method MT2 shown in FIG. 12, a deposit formed on the upper electrode is removed by repeating a cycle C2.

Figure 13:
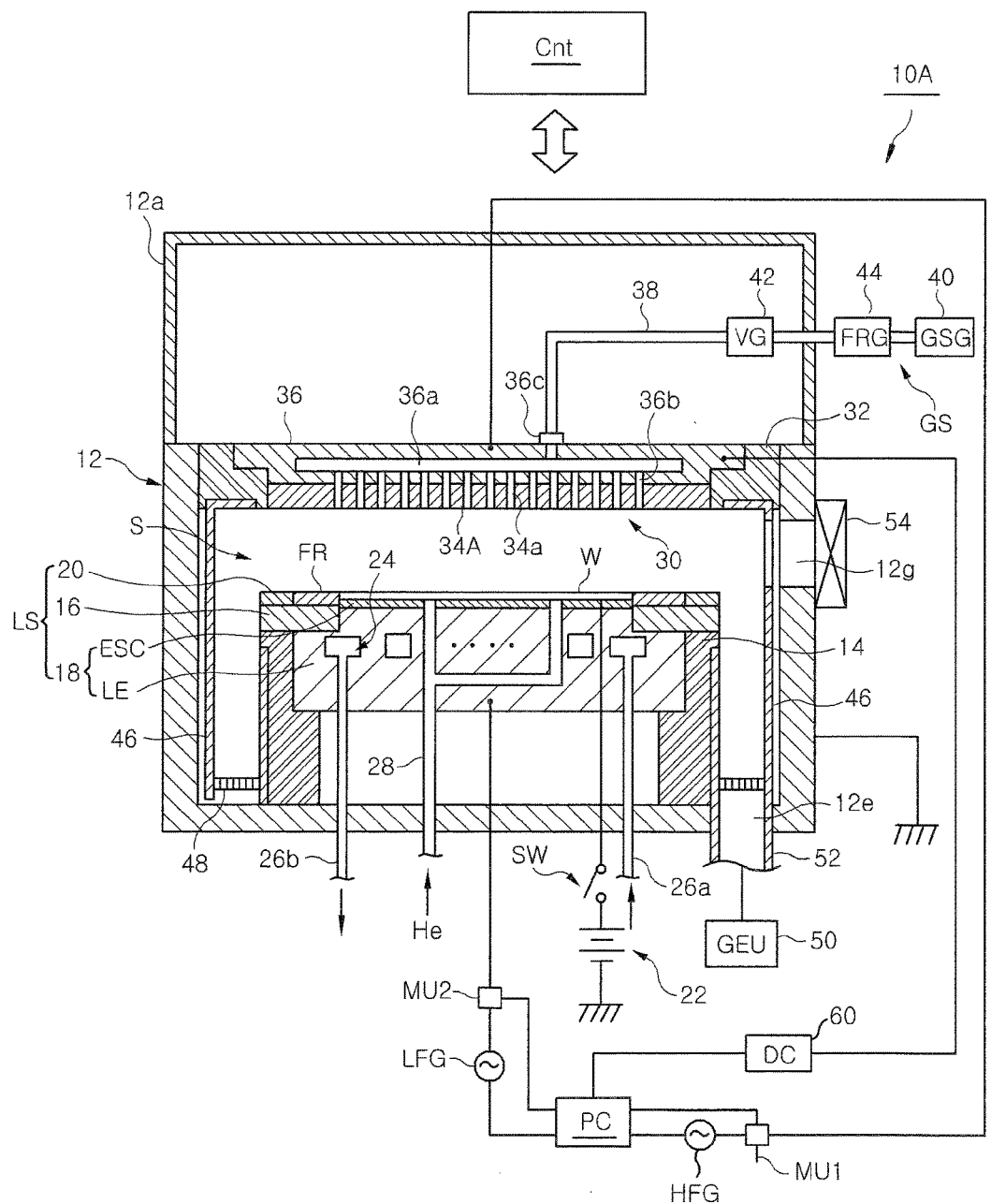
FIG. 13 shows a capacitively coupled parallel plate type plasma processing apparatus in accordance with the another embodiment.

FIG. 13 shows a capacitively coupled parallel plate type plasma processing apparatus in accordance with the another embodiment. The cleaning method MT2 can be applied to cleaning of a plasma processing apparatus 10A shown in FIG. 13. The plasma processing apparatus 10A is different from the plasma processing apparatus 10 in that the upper electrode 30 has a surface portion 34A instead of the surface portion 34. Specifically, the surface portion 34A is made of silicon.

The plasma processing apparatus 10A is different from the plasma processing apparatus 10 in that a DC power supply (DC) 60 is connected to the upper electrode 30. The DC power supply 60 applies a negative DC voltage to the upper electrode 30. The DC power supply 60 is connected to the power control unit PC. The power control unit PC controls a timing of applying a DC voltage from the DC power supply 60 to the upper electrode 30 and an absolute value of the DC voltage.

Figure 14:
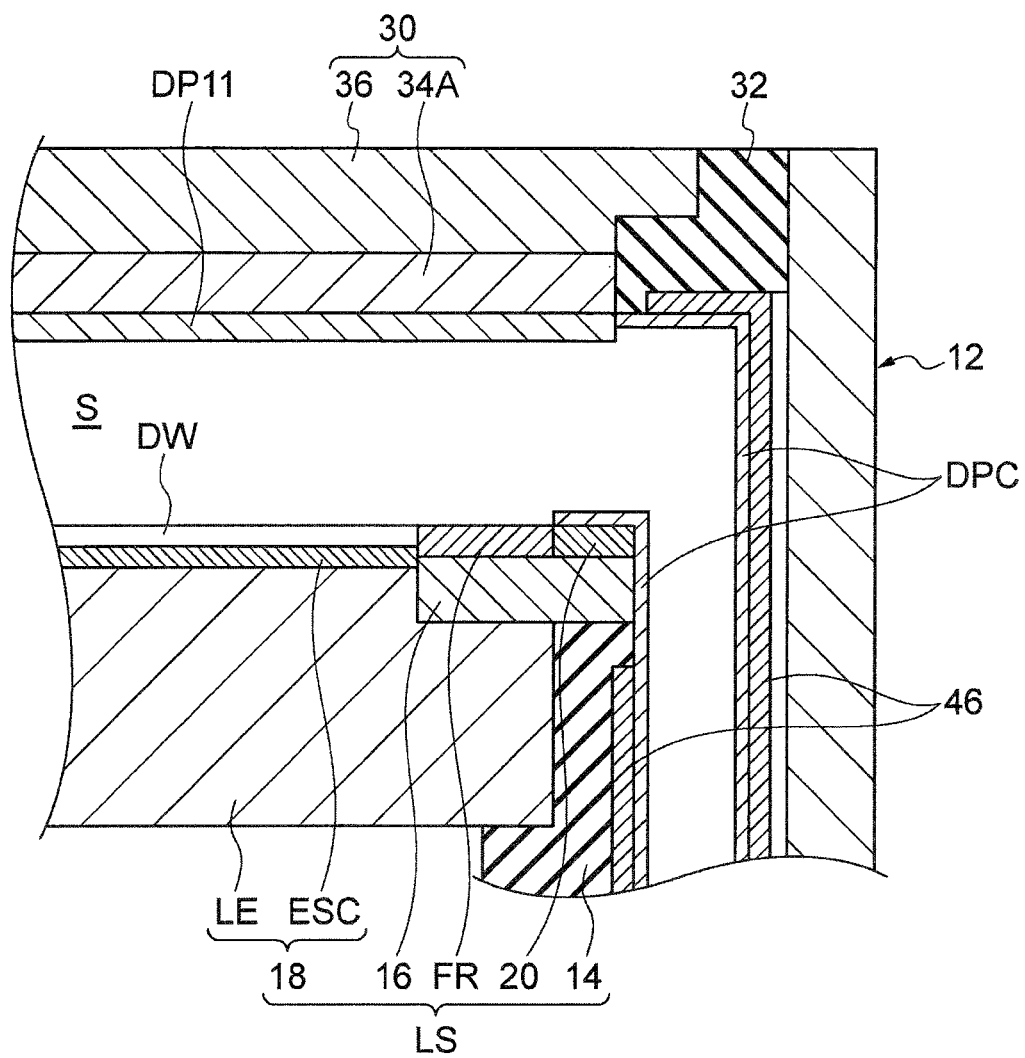
FIGS. 14 to 16 are enlarged cross sectional views each showing a state of a plasma processing apparatus 10A after each step of a cleaning method MT2.
Figure 15:
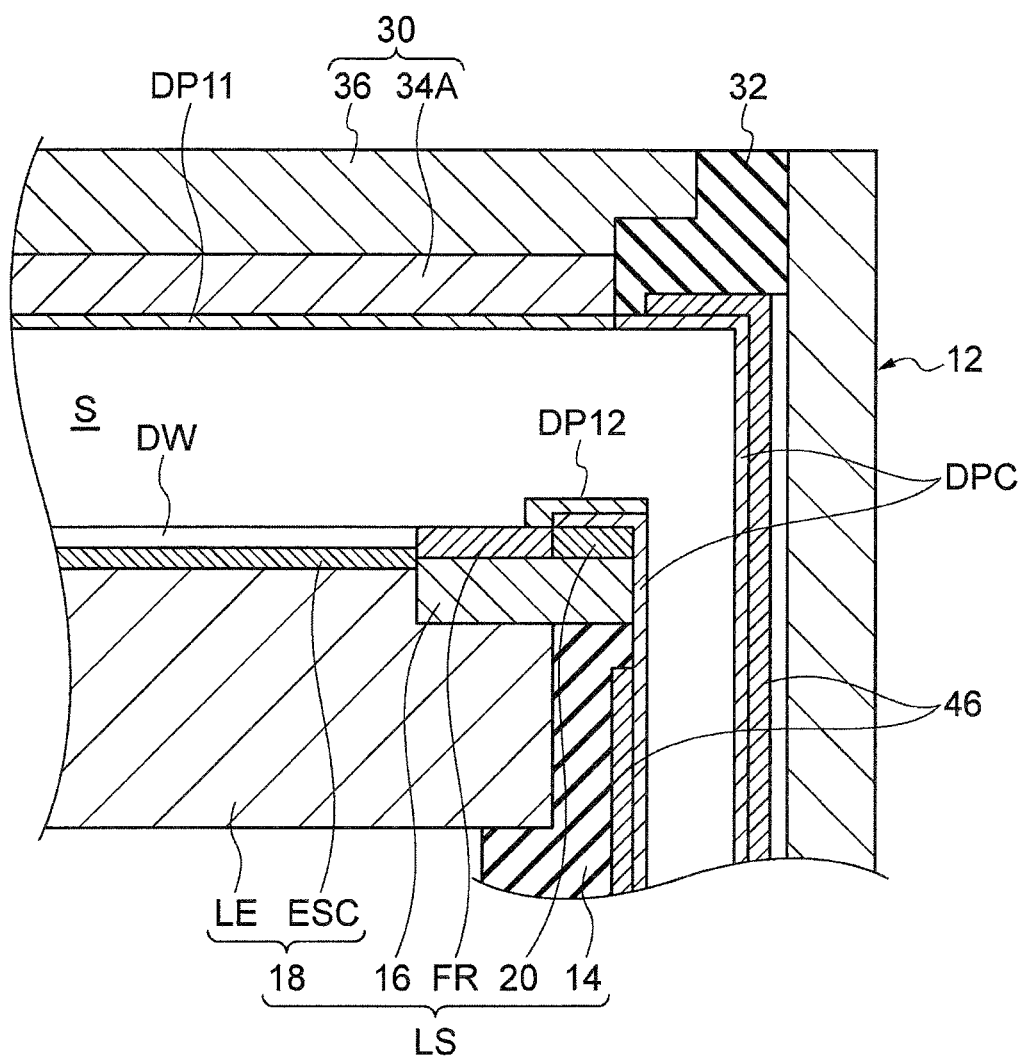
Figure 16:
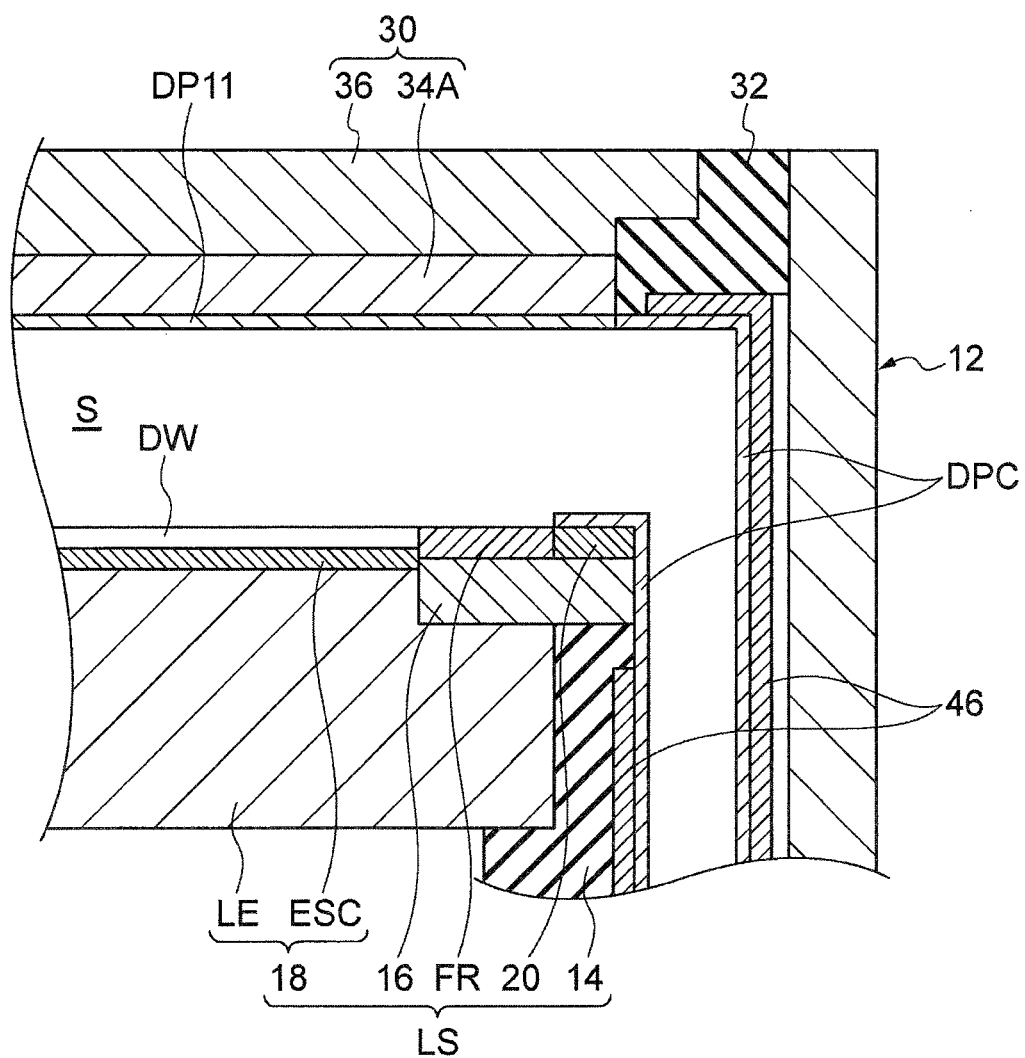

Hereinafter, the cleaning method MT2 will be described with reference to FIG. 12. In the following description, the cleaning method MT2 is applied to the case of cleaning the plasma processing apparatus 10A after etching a Cu layer as a metal layer in the plasma processing apparatus 10A. FIGS. 14 to 16 will be appropriately referred to in the following description. Each of FIGS. 14 to 16 is enlarged cross sectional view showing the state of the plasma processing apparatus 10A after each step of the cleaning method MT2.

Before the cleaning method MT2 is performed, the metal layer of the wafer W is etched in the plasma processing apparatus 10A. When the metal layer is etched, a plasma of a gas containing hydrogen, a rare gas, and hydrocarbon, e.g., a plasma of $H_2$ gas, Ar gas, and $CH_4$ gas, is generated in the processing chamber 12. The metal layer is etched by collision with ions in the plasma thus generated.

As shown in FIG. 14, by etching the metal layer, the metal, e.g., Cu, in the metal layer is etched (scattered) from the metal layer. The etched metal is moved toward the upper electrode 30 by the sheath electric field generated between the upper electrode 30 and the lower electrode LE. Accordingly, the metal in the metal layer is adhered to the surface of the surface portion 34A of the upper electrode 30, thereby forming a first deposit DP11 thereon. Further, as shown in FIG. 14, a carbon-containing deposit DPC is formed on the surface of the lower structure LS opposite to the sidewall of the processing chamber 12 and on the surface of the shield member 46. The cleaning method MT2 removes the first deposit DP11 and the deposit DPC. Therefore, in the cleaning method MT2, the wafer W is first unloaded and, then, a dummy wafer DW is mounted on the mounting table 18 as shown in FIG. 14. The dummy wafer DW may be a silicon substrate.

Next, in the cleaning method MT2, the cycle C2 is repeated. The cycle C2 includes a step ST21 and a step ST22. In the step ST21, the ion sputtering is performed on the first deposit DP11. The ion sputtering of the step ST21 is the same as that of the step ST12 of the cleaning method MT1. Specifically, in the step ST21, a plasma of a rare gas is generated in the processing chamber 12. The rare gas may be Ar gas. In the step ST21, the first high frequency power supplied to the upper electrode and the second high frequency power supplied to the lower electrode LE, i.e., the high frequency bias power are set such that ions of rare gas atoms are accelerated toward the upper electrode 30. In the present embodiment, in the step ST21, a plasma of a hydrogen-containing gas, e.g., $H_2$ gas, may be generated in addition to the plasma of the rare gas. In the present embodiment, in the step ST21, a negative DC voltage may be applied from the DC power supply 60 to the upper electrode 30. When the negative DC voltage is applied to the upper electrode 30, the moving speed of the ions toward the upper electrode 30 can be increased and, thus, a period of time required to remove the first deposit DP11 can be shortened.

In the step ST21, the ions of the rare gas atoms collide with the first deposit DP11. Accordingly, the metal, e.g., Cu, in the first deposit DP11 is sputtered from the first deposit DP11. In the present embodiment, in the step ST21 of one cycle, a part of the first deposit DP11 corresponding to a part of the total thickness of the first deposit DP11 is sputtered from the surface of the first deposit DP11. The sputtered metal is adhered to the surface of the lower structure LS. Accordingly, the second deposit DP12 is formed on the lower structure LS as shown in FIG. 15.

Next, the step ST22 of the cleaning method MT2 is executed. In the step ST22, the second deposit DP12 is removed. Specifically, a plasma of a fluorine-containing gas is generated in the processing chamber 12. The fluorine-containing gas may be, e.g., $NF_3$ gas, and may further contain $H_2$ gas. By executing the step ST22, the second deposit DP2 is removed as shown in FIG. 16.

In the cleaning method MT2, the first deposit D11 can be removed by repeating the cycle C2 of the step ST21 and the step ST22 multiple times. FIGS. 17A and 17B are timing charts showing film thicknesses of the first deposit DP11 and the second deposit DP 12 during the implementation of the cleaning method MT2. In the timing charts shown in FIGS. 17A and 17B, the vertical axis represents film thicknesses of the first deposit DP11 or the second deposit DP12.

FIG. 17A shows the case of completely removing, in the step ST21, the first deposit DP11, adhered to the surface portion 34A of the upper electrode 30 by the etching of the metal layer, and then removing, in the step ST22, the second deposit DP12 formed on the lower structure.

As shown in FIG. 17A, when the initial first deposit DP11 is completely removed in the step ST21 of one cycle C2, the surface portion 34A is exposed in the step ST21. When the surface portion 34A is exposed, the surface portion 34A is damaged in the step ST21 or in the following step ST22. In other words, the surface portion 34A of the upper electrode 30 is etched. In FIG. 17A, a negative value of the film thickness of the first deposit DP11 indicates that the surface portion 34A is damaged, i.e., etched. Further, when the first deposit DP11 is completely removed in the step ST21 of one cycle C2, the film thickness of the second deposit DP12 is increased. Accordingly, the second deposit DP12 may not be removed or a long period of time is required for the removal of the second deposit DP12.

On the other hand, in the cleaning method MT2, a part of the initial first deposit DP11 corresponding to a part of the total thickness of the initial first deposit DP11 is sputtered from the surface of the first deposit DP11 in one cycle C2 as shown in FIG. 17B. Thus, it is possible to reduce the damage to the surface portion 34A and shorten a period of time required to remove the second deposit DP12 in one cycle C2. The amount of the first deposit DP11 sputtered in one cycle C2 can be controlled by controlling the processing time.

Referring back to FIG. 12, in the step ST23 of the cleaning method MT2, it is determined whether or not a completion condition is satisfied. The completion condition is used to determine the completion of repetition of the cycle C2. For example, the completion condition is satisfied when the cycle C2 is repeated a predetermined number of times. Alternatively, the completion of repetition of the cycle C2 may be determined by an end point detection technique.

If it is determined in the step ST23 that the completion condition is not satisfied, the cycle C2 is executed again. On the contrary, if it is determined in the step ST23 that the completion condition is satisfied, the step ST24 is executed.

In the step ST24, a plasma of an oxygen-containing gas is generated in the processing chamber 12. In the step ST24, the carbon-containing deposit DPC is removed. When the step ST24 is completed, the entire steps of the cleaning method MT2 are completed.

In the cleaning method MT2, the first deposit DP11 containing a metal, which is formed on the upper electrode 30, can be removed from the processing chamber 12 by repeating the cycle C2 multiple times. Further, the step ST24 of generating a plasma of an oxygen-containing gas is executed after the cycle C2 is repeated multiple times. Therefore, even if the metal in the first deposit DP11 is a metal having high ionization tendency, i.e., a metal that is easily oxidized, the first deposit DP11 can be removed before the metal is oxidized. The metal that can be removed by the cleaning method MT2, i.e., the metal having high ionization tendency, may be Cu, for example. In addition, the metal may be, e.g., Co, Fe, or Mg.

Hereinafter, there will be described a test example that has been conducted by using the plasma processing apparatus 10A to examine the cleaning method MT2. In the test example, a plasma of $H_2$ gas, Ar gas, and $CH_4$ gas was generated in the processing chamber 12 of the plasma processing apparatus 10A and a Cu layer was etched by the plasma thus generated. Next, the cycle C2 of the cleaning method MT2 was repeated multiple times. The conditions for respective steps of the cycle C2 were set as follows. In both of the step ST21 and the step ST22, each of the first high frequency power and the second high frequency power was kept at the same level in order to prevent the components of the lower structure from being excessively consumed by using, in the step ST22, the second high frequency power greater than the second high frequency power used in the step ST21. Further, in the step ST22, a fluorine-containing gas was mixed with a hydrogen-containing gas in order to effectively remove the second deposit DP12 by preventing a component made of silicon from being etched prior to the second deposit DP12 by the fluorine-containing gas.

Figure 18:
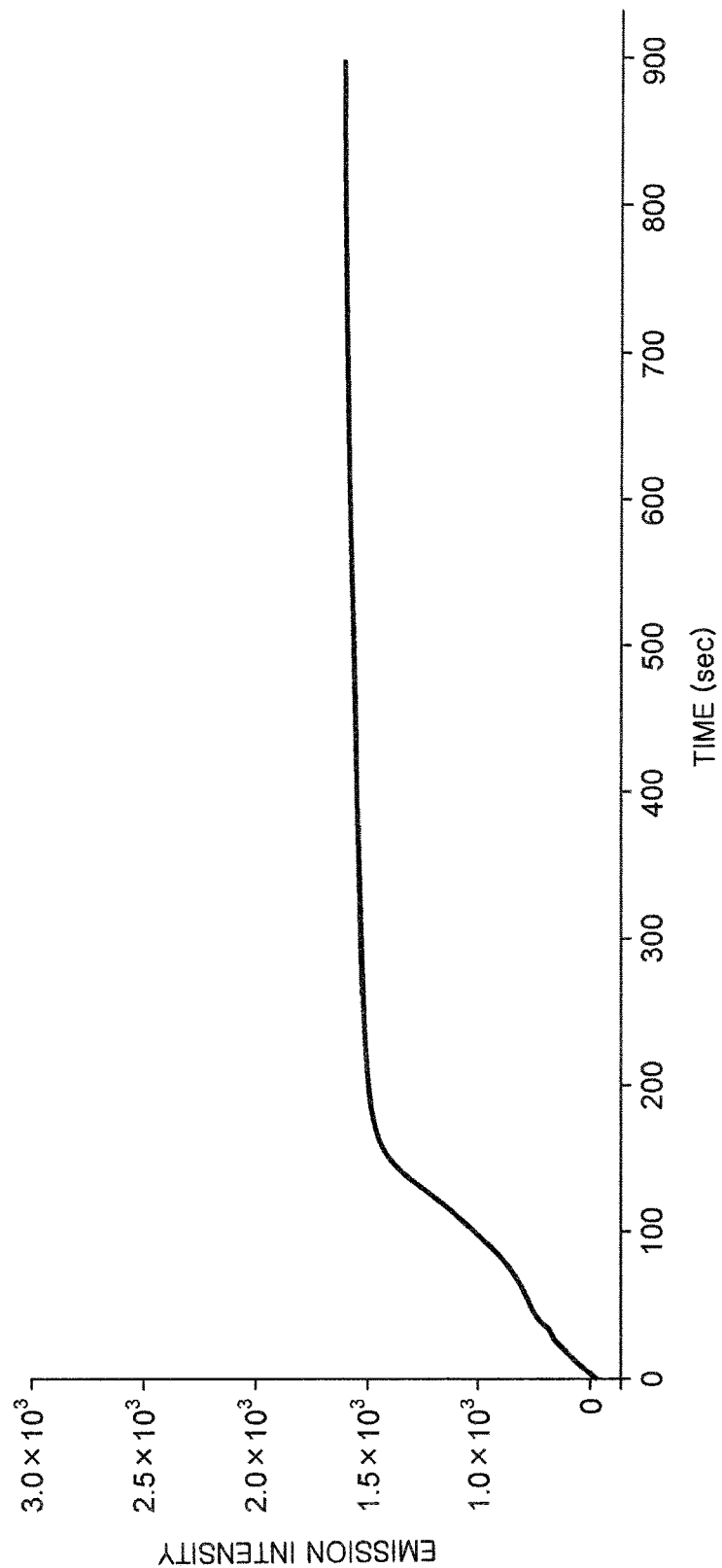
FIG. 18 is a graph showing temporal changes of emission intensity monitored in a test example.

<Step ST21>
Pressure in processing chamber: 10 mTorr (1.333 Pa)
Ar gas: 125 sccm
$H_2$ gas: 125 sccm
First high frequency power: 1500 W
Second high frequency power: 400 W
Processing time: 10 sec <Step ST22>
Pressure in processing chamber: 30 mTorr (4 Pa)
$NF_3$ gas: 200 sccm
$H_2$ gas: 100 sccm
First high frequency power: 1500 W
Second high frequency power: 400 W
Processing time: 5 sec Further, an emission intensity of a wavelength 252 nm in the processing chamber 12 was monitored during the repetitive execution of the cycle C2. The wavelength 252 nm is an emission wavelength of Si. FIG. 18 is a graph illustrating temporal changes of the monitored emission intensity. In the graph of FIG. 18, there are illustrated temporal changes of the emission intensity smoothed by moving average of 30 seconds. The horizontal axis represents time and the vertical axis represents the emission intensity. From the test example, it was found that the emission intensity of Si was gradually increased by repeating the cycle C2 multiple times as shown in FIG. 18. In other words, it was found from the test example that the first deposit DP11 was gradually removed and the surface portion 34A was finally exposed. Therefore, it was found that the first deposit DP11 containing a metal can be removed by repeating the cycle C2 of the cleaning method MT2 multiple times.

While the disclosure has been shown and described with respect to the embodiments, it will be understood by those skilled in the art that various changes and modifications may be made without departing from the scope of the disclosure as defined in the following claims.

What is claimed is:

1. A cleaning method for removing a first deposit formed on an upper electrode by an etching of a metal layer of a substrate, the metal layer containing a metal in a processing chamber of a plasma processing apparatus, the first deposit including the metal, the method comprising:

removing the first deposit by ion sputtering; and
removing a second deposit, which is generated by said removing the first deposit and formed on a lower structure of the processing chamber,
wherein a cycle including said removing the first deposit and said removing the second deposit is repeated multiple times, wherein in said removing the first deposit, a plasma of a gas containing a rare gas is generated in the processing chamber and ions in the plasma of the gas containing the rare gas are made to collide with the first deposit, wherein the upper electrode has a portion made of silicon oxide, wherein the portion is in contact with a space where the plasma is generated, wherein the second deposit contains the metal and the silicon oxide, wherein said removing the second deposit includes:

(i) removing the silicon oxide contained in the second deposit, and (ii) removing the metal contained in the second deposit by ion sputtering, and wherein the cycle further includes removing a third deposit, which is generated by said removing the second deposit and formed on the upper electrode, and wherein the lower structure includes a lower electrode, and in said removing the metal contained in the second deposit, a first high frequency power is applied to the upper electrode and a second high frequency power is applied to the lower electrode such that the ions in the plasma are accelerated toward the lower electrode by setting the second high frequency power to be greater than the first high frequency power.

2. The method of claim 1, wherein the gas further contains hydrogen.

3. The method of claim 1, wherein in said removing the silicon oxide, a plasma of a fluorine-containing gas is generated in the processing chamber.

4. The method of claim 1, wherein in said removing the metal contained in the second deposit, a plasma of a gas containing a rare gas is generated in the processing chamber and ions in the plasma of the gas containing the rare gas are made to collide with the metal in the second deposit.

5. The method of claim 1, wherein in said removing the third deposit, a plasma of a fluorine-containing gas is generated in the processing chamber.

6. The method of claim 1, wherein the metal layer contains at least one of Pt, Ru, Au, Rh, Pd, Os, and Ir.

7. The method of claim 6, the metal layer contains PtMn.

8. The method of claim 6, wherein the metal layer is etched by a plasma of a gas containing hydrogen, a rare gas, and hydrocarbon, and wherein the method further includes generating a plasma of an oxygen-containing gas in the processing chamber to remove deposits formed on inner surfaces of the processing chamber by said etching the metal layer.

9. The method of claim 1, wherein the metal layer contains at least one of Cu, Co, Fe, and Mg.

10. The method of claim 9, wherein the metal layer is etched by a plasma of a gas containing hydrogen, a rare gas, and hydrocarbon, wherein the method further includes generating a plasma of an oxygen-containing gas in the processing chamber to remove deposits formed on inner surfaces of the processing chamber by said etching the metal layer, and wherein said generating the plasma of the oxygen-containing gas is performed after the cycle is repeated multiple times.

11. The method of claim 1, wherein in said removing the second deposit, a plasma of a gas containing fluorine and hydrogen is generated in the processing chamber.

12. The method of claim 11, wherein the metal layer contains Cu.

13. The method of claim 12, wherein the metal layer is etched by a plasma of a gas containing hydrogen, a rare gas, and hydrocarbon, wherein the method further includes generating a plasma of an oxygen-containing gas in the processing chamber to remove deposits formed on inner surfaces of the processing chamber by said etching the metal layer, and wherein said generating the plasma of the oxygen-containing gas is performed after the cycle is repeated multiple times.

* * * * *